US012690228B2

(12) United States Patent
Kumagai et al.

(10) Patent No.: US 12,690,228 B2
(45) Date of Patent: Jul. 21, 2026

(54) SUPERJUNCTION SEMICONDUCTOR DEVICE HAVING VARYING IMPURITY CONCENTRATIONS BETWEEN SEMICONDUCTOR SUBSTRATE AND PARALLEL PN STRUCTURE

(71) Applicants: FUJI ELECTRIC CO., LTD., Kawasaki (JP); NATIONAL INSTITUTE OF ADVANCED INDUSTRIAL SCIENCE AND TECHNOLOGY, Tokyo (JP)

(72) Inventors: Naoki Kumagai, Nagano (JP); Masakazu Okada, Tsukuba (JP); Shinsuke Harada, Tsukuba (JP)

(73) Assignees: FUJI ELECTRIC CO., LTD., Kawasaki (JP); NATIONAL INSTITUTE OF ADVANCED INDUSTRIAL SCIENCE AND TECHNOLOGY, Tokyo (JP)

( * ) Notice: Subject to any disclaimer, the term of this patent is extended or adjusted under 35 U.S.C. 154(b) by 480 days.

(21) Appl. No.: 18/297,559

(22) Filed: Apr. 7, 2023

(65) Prior Publication Data

US 2023/0246102 A1 Aug. 3, 2023

Related U.S. Application Data

(63) Continuation of application No. PCT/JP2021/044586, filed on Dec. 3, 2021.

(30) Foreign Application Priority Data

Dec. 4, 2020 (JP) ................................. 2020-201631

(51) Int. Cl.
H10D 30/66 (2025.01)
H10D 62/10 (2025.01)
H10D 62/832 (2025.01)

(52) U.S. Cl.
CPC ......... *H10D 30/665* (2025.01); *H10D 62/112* (2025.01); *H10D 62/127* (2025.01); *H10D 62/8325* (2025.01)

(58) Field of Classification Search
None
See application file for complete search history.

(56) References Cited

U.S. PATENT DOCUMENTS 6,300,171 B1 10/2001 Frisina
6,677,626 B1 1/2004 Shindou et al.
(Continued)

FOREIGN PATENT DOCUMENTS

JP 2000-183350 A 6/2000
JP 2001-015752 A 1/2001
(Continued)

OTHER PUBLICATIONS

International Search Report for PCT/JP2021/044586, mailed on Feb. 15, 2022.
(Continued)

*Primary Examiner* — Christine S. Kim
*Assistant Examiner* — Andrew Victor Prostor
(74) *Attorney, Agent, or Firm* — Rabin & Berdo, P.C.

(57) ABSTRACT

A superjunction semiconductor device having a termination structure portion surrounding an active region in a plan view. The device includes: a semiconductor substrate; a first semiconductor layer provided on the semiconductor substrate; and a parallel pn structure and a channel stopper provided in the first semiconductor layer. The channel stopper surrounds the parallel pn structure in the plan view, and contacts the parallel pn structure in the termination structure portion. The parallel pn structure includes a plurality of first columns each having a first width and a plurality of second columns each having a second width that (Continued)

repeatedly alternate one another parallel to the main surface. In a region of the parallel pn structure contacting the channel stopper, a product of the second width and an impurity concentration of the second columns is less than a product of the first width and an impurity concentration of the first columns.

15 Claims, 26 Drawing Sheets

(56) References Cited

U.S. PATENT DOCUMENTS

| | | | |
|---|---|---|---|
| 2001/0028083 | A1 | 10/2001 | Onishi et al. |
| 2003/0222327 | A1 | 12/2003 | Yamaguchi et al. |
| 2010/0032791 | A1 | 2/2010 | Hozumi et al. |
| 2010/0163972 | A1 | 7/2010 | Saggio et al. |
| 2013/0037852 | A1 | 2/2013 | Tamaki |
| 2014/0151785 | A1* | 6/2014 | Akagi .................. H10D 30/668 257/329 |
| 2016/0293693 | A1 | 10/2016 | Niimura et al. |
| 2017/0271442 | A1 | 9/2017 | Uehara |

| | | | | |
|---|---|---|---|---|
| 2018/0047843 | A1* | 2/2018 | Tamaki | ................ H10D 64/112 |
| 2019/0081172 | A1 | 3/2019 | Arai et al. | |
| 2019/0157399 | A1* | 5/2019 | Kosugi | .................. H10D 62/81 |

FOREIGN PATENT DOCUMENTS

| | | | |
|---|---|---|---|
| JP | 2001-298190 | A | 10/2001 |
| JP | 2003-273355 | A | 9/2003 |
| JP | 2010-040973 | A | 2/2010 |
| JP | 2013-041920 | A | 2/2013 |
| JP | 2015-060841 | A | 3/2015 |
| JP | 2015-164218 | A | 9/2015 |
| JP | 2016-197633 | A | 11/2016 |
| JP | 2017168666 | A | 9/2017 |
| JP | 2018-164098 | A | 10/2018 |
| WO | 2013/046544 | A1 | 4/2013 |

OTHER PUBLICATIONS

Written Opinion of the International Searching Authority for PCT/JP2021/044586, mailed on Feb. 15, 2022.

Japanese Office Action dated Sep. 24, 2024, in the counterpart Japanese Patent Application No. 2022-567017.

Office Action issued for corresponding Japanese Patent Application No. 2025-082007, with machine translation, dated Feb. 17, 2026.

\* cited by examiner

FIG.5A
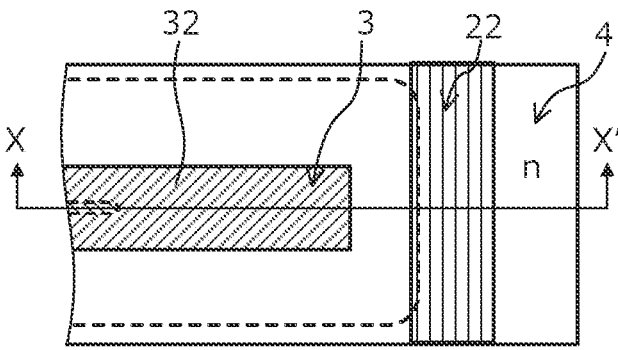
FIG.5B
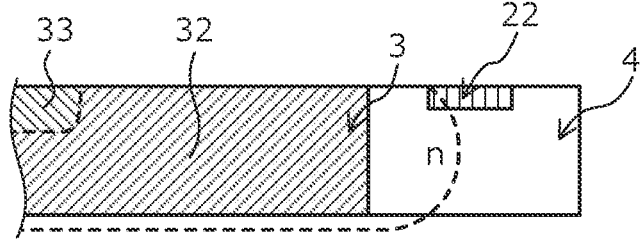
FIG.6A
FIG.6B

FIG.8B
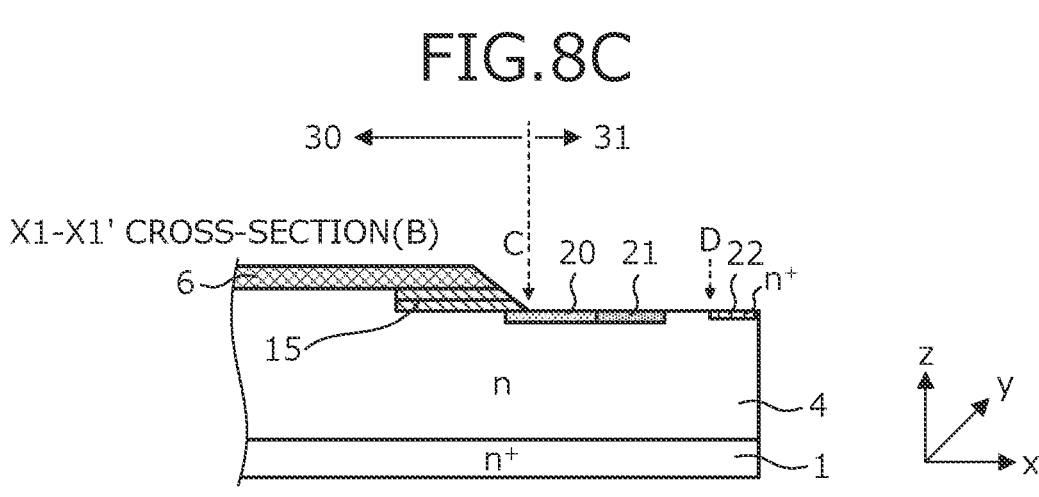
FIG.8C
FIG.9A
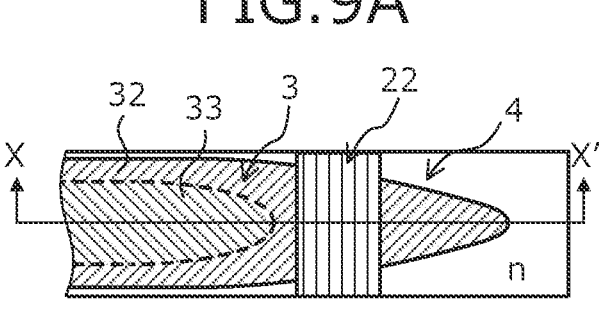

SUPERJUNCTION SEMICONDUCTOR DEVICE HAVING VARYING IMPURITY CONCENTRATIONS BETWEEN SEMICONDUCTOR SUBSTRATE AND PARALLEL PN STRUCTURE

CROSS REFERENCE TO RELATED APPLICATIONS

This is a continuation application of International Application PCT/JP2021/044586 filed on Dec. 3, 2021 which claims priority from a Japanese Patent Application No. 2020-201631 filed on Dec. 4, 2020, the contents of which are incorporated herein by reference.

BACKGROUND OF THE INVENTION

1. Field of the Invention

Embodiments of the invention relate to a superjunction semiconductor device.

2. Description of the Related Art

In a general n-type channel vertical metal oxide semiconductor field effect transistor (MOSFET), i.e., an insulated gate field effect transistor, among semiconductor layers formed in a semiconductor substrate thereof, an n-type conductive layer (drift layer) is the semiconductor layer with the highest resistance. Electrical resistance of the n-type drift layer greatly affects the on-resistance of the vertical MOSFET overall. Reduction of the on-resistance of the vertical MOSFET overall may be achieved by reducing the thickness of the n-type drift layer and shortening the current path.

Nonetheless, in a vertical MOSFET, during an off state, a depletion layer spreads to the n-type drift layer, which has a high resistance, and thus, the depletion layer has a function of sustaining the breakdown voltage. Therefore, when the thickness of the n-type drift layer is reduced to reduce the on-resistance, the spreading of the depletion layer during the off state decreases, whereby the breakdown field strength is easily reached by an application of a low voltage and the breakdown voltage decreases. On the other hand, to increase the breakdown voltage of the vertical MOSFET, the thickness of the n-type drift layer has to be increased, whereby the on-resistance increases. This type of relationship between the on-resistance and the breakdown voltage is called a tradeoff relationship and enhancing both members having a tradeoff relationship is generally difficult.

A superjunction (SJ) structure is known as a semiconductor device structure that resolves the problems described above. For example, a MOSFET (hereinafter, SJ-MOSFET) having a superjunction structure (SJ structure) is known.

FIG. 24 is a plan view depicting a structure of the conventional superjunction semiconductor device. As depicted in FIG. 24, a SJ-MOSFET 140 has an active region 130 and an edge termination region 131 that surrounds a periphery of the active region 130. The active region 130 is a region through which current flows during an on-state. The edge termination region 131 is a region that mitigates electric field of a wafer-front-side of a drift region.

The SJ-MOSFET 140 has, in the active region 130 and the edge termination region 131, a parallel structure (hereinafter, a parallel pn structure 119) in which p-type column regions 103 and n-type column regions 104 are arranged so as to repeatedly alternate with one another. In the parallel pn structure 119, an impurity amount contained by the p-type column regions 103 and an impurity amount contained by the n-type column regions 104 are substantially equal, whereby in the off state, a pseudo non-doped layer is created, enabling facilitation of a high breakdown voltage.

FIGS. 25A, 25B, and 25C are cross-sectional views depicting the structure of the conventional superjunction semiconductor device. FIG. 25A is a cross-sectional view along Y-Y' in FIG. 24. FIG. 25B is a cross-sectional view along X-X' in FIG. 24. FIG. 25C is a cross-sectional view along X1-X1' in FIG. 24. Further, FIG. 25B is a cross-sectional view of a portion A in FIG. 25A. FIG. 25C is a cross-sectional view of a portion B in FIG. 25A.

As depicted in FIGS. 25A to 25C, the SJ-MOSFET 140 uses, as a material, a wafer in which an n-type drift layer 102 is grown on an n$^+$-type semiconductor substrate 101 having a high impurity concentration. The n-type drift layer 102 has the parallel pn structure 119 in which the p-type column regions 103 and the n-type column regions 104 are arranged so as to repeatedly alternate with one another in a plane parallel to a substrate main surface; the p-type column regions 103 extend in a direction orthogonal to the substrate main surface and penetrate through the n-type drift layer 102 from the wafer surface; each of the p-type column regions 103 has a narrow width in a plane parallel to the substrate main surface; and each of the n-type column regions 104 is sandwiched by an adjacent two of the p-type column regions 103. In FIGS. 25A and 25B, while the p-type column regions 103 reach the n$^+$-type semiconductor substrate 101, configuration may be such that the p-type column regions 103 do not reach the n$^+$-type semiconductor substrate 101.

In the active region 130, on the parallel pn structure 119 of the SJ-MOSFET 140, a p-type base region 106 is provided. In the p-type base region 106, n$^+$-type source regions 107 are provided. A p$^+$-type contact region may be provided in the p-type base region 106. Further, trenches 118 that penetrate through the p-type base region 106 and the n$^+$-type source regions 107 and reach the p-type column regions 103 are provided. The n$^+$-type source regions 107 are disposed so as to be in contact with side surfaces of the trenches 118.

Further, in the parallel pn structure 119, first p$^+$-type base regions 114 are selectively provided so as to entirely cover bottoms of the trenches 118, respectively. In the parallel pn structure 119, at a first surface thereof opposite to a second surface thereof facing the n$^+$-type semiconductor substrate 101, second p$^+$-type base regions 115 are selectively provided.

Each of the trenches 118 is embedded with a gate insulating film 109 that covers the surface of the inner wall, the gate insulating film 109 being constituted by, for example, an oxide film and a gate electrode 110 formed on the surface of the gate insulating film 109 is further embedded in each of the trenches 118. Thus, the trench gate structure is configured. Further, ohmic electrodes (not depicted) are electrically in contact with the p-type base region 106 and the n$^+$-type source regions 107 through contact holes formed in an interlayer insulating film (not depicted).

Further, at the back side of the n$^+$-type semiconductor substrate 101, a back electrode (not depicted) electrically connected to the n$^+$-type semiconductor substrate 101 is formed.

In the edge termination region 131, the p-type base region 106 and the second p$^+$-type base regions 115 are entirely removed, thereby forming a recess where the edge termination region 131 is lower (recessed toward a drain) than is the active region 130 and at a bottom of the recess, the parallel pn structure 119 is exposed. In an instance in which the p-type base region 106 is formed by epitaxial growth, the recess is formed by removing the p-type base region 106 in the edge termination region 131 and thus, is unnecessary in an instance in which the p-type base region 106 is formed by ion implantation.

Further, in the edge termination region 131, a JTE structure in which multiple p-type regions (herein, two including a first JTE region 120 and a second JTE region 121) are disposed is provided. Further, an n$^+$-type region 122 that functions as a channel stopper is provided closer to an end of the chip (chip end) than is the JTE structure.

In the parallel pn structure 119, at portions thereof exposed at the bottom of the recess, the first JTE region 120 and the second JTE region 121 are each selectively provided. When high voltage is applied, high voltage in a lateral direction other than that in the active region 130 is ensured by pn junctions between the first JTE region 120, the second JTE region 121, and the n-type column regions 104.

In particular, a SJ structure is known to have low avalanche breakdown capability in a design in which the impurity amount contained by the p-type column regions 103 and the impurity amount contained by the n-type column regions 104 are substantially equal and charge balanced, whereby static breakdown voltage becomes highest. Further, when the charge is slightly unbalanced, particularly, in a structure (p-rich structure) in which the amount of charge of the p-type column regions 103 is greater than the amount of charge of the n-type column regions 104, the avalanche breakdown capability is known to be high. Further, it is known that the avalanche breakdown capability may be increased by a structure in which, in a depth direction of the SJ structure, near the surface is p-rich while near the substrate (drain) the amount of charge of the n-type column regions 104 is greater than the amount of charge of the p-type column regions 103 (n-rich), and by increasing a degree of margin for variation of the amount of charge.

Further, according to a known MOSFET, the average positive charge density $\rho(x)$ thereof at a predetermined depth of the SJ structure when the MOSFET turns off and the SJ structure is depleted is expressed by an increasing concave down curve, whereby variation of switching characteristics during turn-off is smaller than that conventionally (for example, refer to Japanese Laid-Open Patent Publication No. 2018-164098). Further, a semiconductor device is known in which p-type column regions do not reach a channel stopper in a longitudinal direction of the p-type column regions, and in a direction in which the n-type column regions and the p-type column regions are arranged, directly beneath the channel stopper is free of p-type column regions (for example, refer to Japanese Laid-Open Patent Publication No. 2015-164218).

Further, in a known semiconductor device that includes, in a peripheral region, a region in which in an outer peripheral direction of a cell region, the amount of an N-type charge in the superjunction structure gradually becomes greater than the amount of a P-type charge (for example, refer to International Publication No. WO 2013/046544). Further, a known semiconductor device has in a junction termination region portion, an n-type drift layer through which drift current flows during an on-state and that depletes during an off-state and p-type drift layer that depletes during the off-state and additionally has a second n-type drift layer and a second p-type drift layer formed in at least one of two orthogonal directions (for example, refer to Japanese Laid-Open Patent Publication No. 2003-273355). Further, a semiconductor device is known in which a final edge structure is formed that has two columns inserted in multiple superimposed semiconductor layers in which multiple N-type superimposed semiconductor layers and multiple P-type doped regions are stacked, and a column close to a high voltage semiconductor device is deeper than a column that is far from the device (for example, refer to Japanese Laid-Open Patent Publication No. 2000-183350). Further, a semiconductor device is known in which by a superjunction structure in which pairs of a p-type epitaxial embedded layer and an n-type epitaxial layer are alternately arranged while in a termination portion, a p-type horizontal RESURF region is provided and each p-type epitaxial embedded layer of the termination portion is free of overlap since at least a part of a surface portion is free of the p-type horizontal RESURF region (for example, refer to Japanese Laid-Open Patent Publication No. 2010-040973).

SUMMARY OF THE INVENTION

According to an embodiment of the invention, a superjunction semiconductor device, having an active region through which a current flows, and a termination structure portion, which is disposed at an outer periphery of the active region in a plan view of the superjunction semiconductor device, and in which a voltage withstanding structure is formed, the superjunction semiconductor device includes: a semiconductor substrate of a first conductivity type having a main surface; a first semiconductor layer of the first conductivity type, provided on the main surface of the semiconductor substrate, the first semiconductor layer having an impurity concentration that is lower than an impurity concentration of the semiconductor substrate; a parallel pn structure provided in the first semiconductor layer at a surface thereof; and a channel stopper provided in the first semiconductor layer at the surface thereof, the channel stopper surrounding the parallel pn structure in the plan view of the device, and being in contact with the parallel pn structure in the termination structure portion. The parallel pn structure includes: a plurality of first columns of the first conductivity type each having a first width in a width direction, and a plurality of second columns of a second conductivity type each having a second width in the width direction, the first and second columns repeatedly alternating one another in a striped pattern parallel to the main surface. In a region of the parallel pn structure in contact with the channel stopper, a product obtained by multiplying the second width and an impurity concentration of the plurality of second columns is less than a product obtained by multiplying the first width and an impurity concentration of the plurality of first columns.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 5A is a view of a simulated edge termination region in the superjunction semiconductor device according to the first embodiment.

FIG. 5B is a view of the simulated edge termination region in the superjunction semiconductor device according to the first embodiment.

FIG. 6A is a cross-sectional view depicting a state of the superjunction semiconductor device according to the first embodiment during manufacture.

FIG. 6B is a cross-sectional view depicting a state of the superjunction semiconductor device according to the first embodiment during manufacture.

FIG. 8B is a cross-sectional view of the structure of the superjunction semiconductor device according to the second embodiment in FIG. 7.

FIG. 8C is a cross-sectional view of the structure of the superjunction semiconductor device according to the second embodiment in FIG. 7.

FIG. 9A is a view of a simulated edge termination region in the superjunction semiconductor device according to the second embodiment.

DETAILED DESCRIPTION OF THE INVENTION

First, problems associated with the conventional techniques are discussed. When the surface portion is p-rich and the JTE structure is formed in the p-type column regions 103, the p-rich state increases, depletion of the p-type column regions 103 is difficult, electric field tends to concentrate between the channel stopper and the p-type column regions 103, and the breakdown voltage may decrease.

Further, in an outer periphery of the edge termination region 131 as well, the p-type column regions 103 are present and when a neutral region of the source potential is present in the p-type column regions 103 due a relatively low voltage by which the p-type column regions 103 are not completely depleted, high electric field is applied between the channel stopper of the drain potential and the p-type column regions 103 and thus, there is a concern that the breakdown voltage may decrease.

Even in such an instance, when a higher voltage is applied, the p-type column regions 103 are completely depleted and thus, electric field is mitigated, nonetheless, there is a concern that avalanche current flows due to the process of voltage increase. In particular, in an instance in which a p-rich state is set to enhance avalanche breakdown capability or an instance in which a surface side is p-rich, there is an increased concern that this malfunction may occur.

Figure 26A:
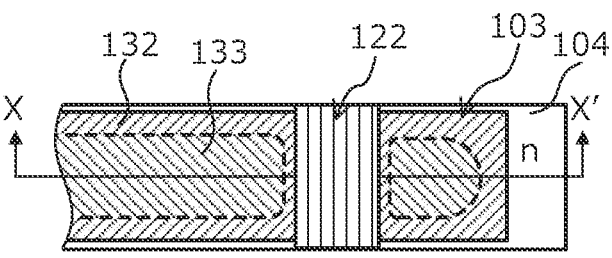
FIG. 26A is diagram depicting spreading of a depletion layer by a low voltage (Vds1) in an edge termination region of the conventional superjunction semiconductor device.
Figure 26B:
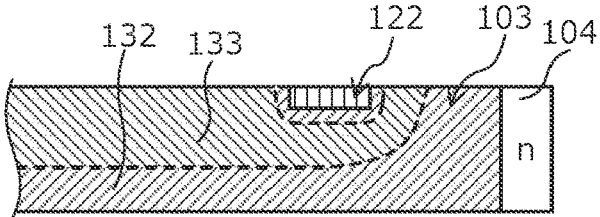
FIG. 26B is diagram depicting spreading of the depletion layer by the low voltage (Vds1) in the edge termination region of the conventional superjunction semiconductor device.

FIGS. 26A and 26B are diagrams depicting spreading of a depletion layer by a low voltage (Vds1) in the edge termination region of the conventional superjunction semiconductor device. FIG. 26A is a plan view; FIG. 26B is a cross-sectional view along X-X' in FIG. 26A. Here, depletion layers near the n-type column regions 104 and near the channel stopper are not depicted. Similarly in FIGS. 27A to 28B. As depicted in FIGS. 26A and 26B, a source-drain voltage is applied to a depletion layer 132 that spreads from junctions between the channel stopper (the $n^+$-type region 122) of the drain potential and the p-type column regions 103 by a low drain-source voltage Vds1. The breakdown voltage at this time is a breakdown voltage of junctions between the channel stopper (the $n^+$-type region 122) and the p-type column regions 103.

Figure 27A:
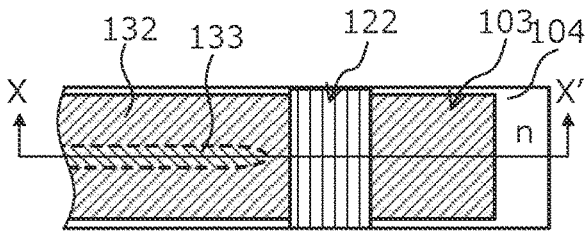
FIG. 27A is a diagram depicting spreading of a depletion layer by an intermediate voltage (Vds2) in the edge termination region of the conventional superjunction semiconductor device.
Figure 27B:
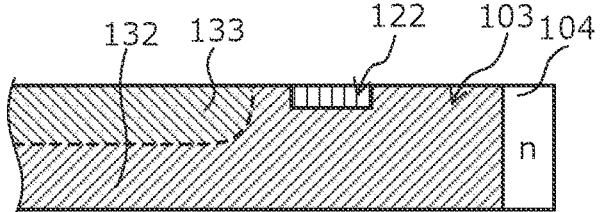
FIG. 27B is a diagram depicting spreading of the depletion layer by the intermediate voltage (Vds2) in the edge termination region of the conventional superjunction semiconductor device.

FIGS. 27A and 27B are diagrams depicting spreading of a depletion layer by an intermediate voltage (Vds2) in the edge termination region of the conventional superjunction semiconductor device. FIG. 27A is a plan view; FIG. 27B is a cross-sectional view along X-X' in FIG. 27A. As depicted in FIGS. 27A and 27B, by the higher voltage Vds2, the depletion layer 132 that spreads from the junctions between the p-type column regions 103 and the n-type column regions 104 is connected to the depletion layer 132 that spreads from the junction between the channel stopper (the $n^+$-type region 122) and the p-type column regions 103.

Figure 28A:
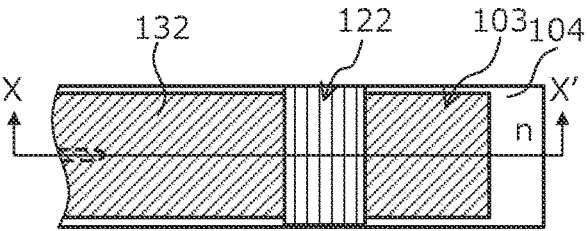
FIG. 28A is a diagram depicting spreading of a depletion layer by a high voltage (Vds3) in the edge termination region of the conventional superjunction semiconductor device.
Figure 28B:
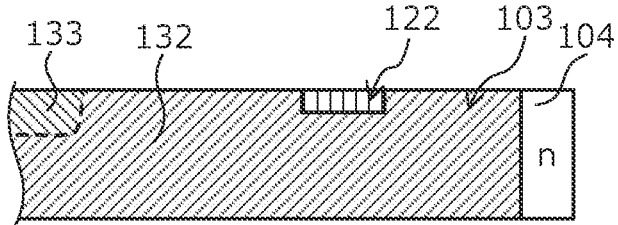
FIG. 28B is a diagram depicting spreading of the depletion layer by the high voltage (Vds3) in the edge termination region of the conventional superjunction semiconductor device.

FIGS. 28A and 28B are diagrams depicting spreading of a depletion layer by a high voltage (Vds3) in the edge termination region of the conventional superjunction semiconductor device. FIG. 28A is a plan view; FIG. 28B is a cross-sectional view along X-X' in FIG. 28A. As depicted in FIGS. 28A and 28B, when the voltage Vds2 is equal to or lower than the breakdown voltage of the junctions between the channel stopper (the $n^+$-type region 122) and the p-type column regions 103, and the drain-source voltage is increased to be Vds3, the depletion layer 132 that spreads from the junctions between the p-type column regions 103 and the n-type column regions 104 further spreads and a distance between an neutral region 133 and the channel stopper (the $n^+$-type region 122) increases and thus, while breakdown does not occur by a low voltage, when a voltage lower than Vds2 becomes at least equal to the breakdown voltage of the junctions between the channel stopper (the $n^+$-type region 122) and the p-type column regions 103, breakdown occurs by a low voltage. In an instance in which a p-rich state is set to increase the avalanche breakdown capability and an instance in which the surface side is p-rich, problems occur particularly easily.

Figure 29A:
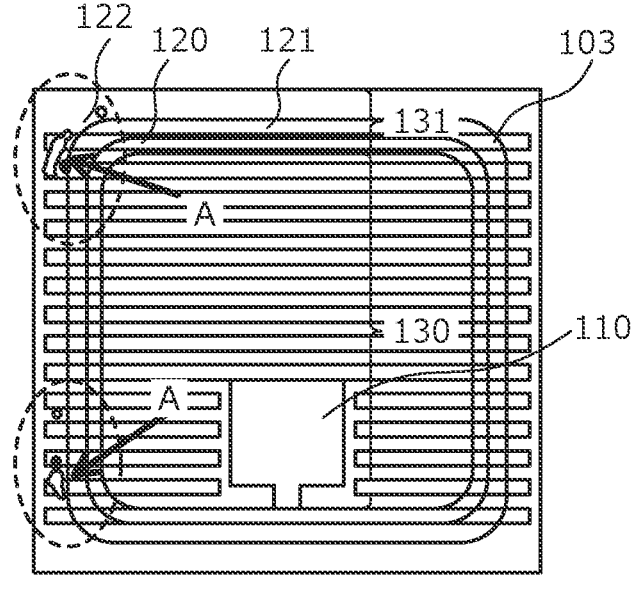
FIG. 29A is a diagram depicting locations of breakdown in a SJ-SiC MOSFET of a breakdown voltage class of 1200V, under a high temperature (175 degrees C.).
Figure 29B:
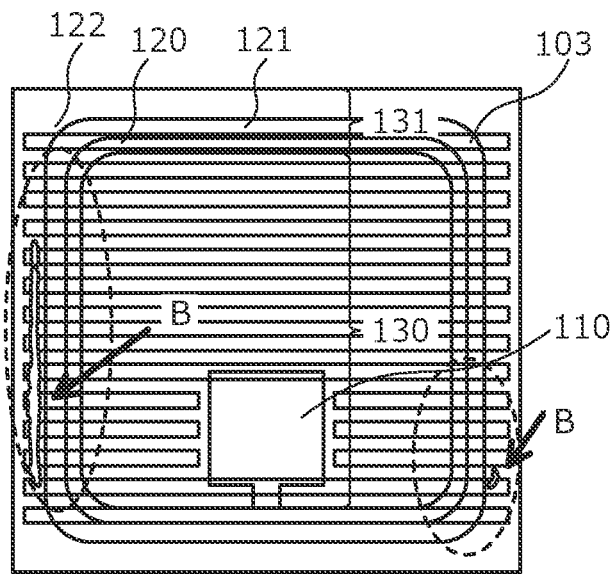
FIG. 29B is a diagram depicting the locations of breakdown in the SJ-SiC MOSFET of a breakdown voltage class of 1200V, under a high temperature (175 degrees C.).

Further, FIGS. 29A and 29B are diagrams depicting locations of breakdown in a SJ-SiC MOSFET of a breakdown voltage class of 1200V, under a high temperature (175 degrees C.). FIGS. 29A and 29B are examples of different chips, in an instance of a +50% p-rich state and high temperature (175 degrees C.), breakdown locations are identified by observing light emitted from the surface.

As indicated by arrow A in FIG. 29A, it is found that light is emitted by the p-type column regions 103 of portions in contact with the first JTE region 120 having a ring shape surrounding the active region 130 and the n⁺-type region 122 further surrounding an outer side of the second JTE region 121. Further, as indicated by arrow B in FIG. 29B, it is found that light is emitted along the n⁺-type region 122, which is further outward (closer to the chip end) than are the first JTE region 120 and the second JTE region 121, and light is emitted at locations other than the p-type column regions 103. Further, as depicted in FIGS. 29A and 29B, it is found that while no light is emitted along upper and lower sides of the chip, in a lateral direction of the chip, i.e., at longitudinal ends of the p-type column regions 103, light is emitted. This is because the n⁺-type region 122 and the overlapping p-type column regions 103 of the upper and lower sides of the chip are not connected directly to the source potential an thus, due to the progress of the depletion of the JTE regions 120, 121 by a low voltage etc., the p-type column regions 103 are floating and even when neutral regions are present in the p-type column regions 103, the potential is between the drain potential and the source potential, whereby breakdown does not occur.

In this manner, in the structure of the SJ-MOSFET 140, the breakdown voltage decreases at high temperatures and when the breakdown voltage has decreased, electric field concentrates at locations where the p-type column regions 103 and the high-concentration n⁺-type region 122 are in contact with each other, whereby breakdown occurs. This is because, for SiC, Al is used as a p-type impurity and Al is the shallowest as a p-type acceptor metal. Further, in SiC, deep electron traps and/or hole traps are present, in particular, a large amount of deep electron traps and/or deep hole traps are known to be generated by Al ion-implantation. Thus, a cause is thought to be that majority carriers caught by a deep trap at room temperature are de-trapped by a high temperature, whereby the depletion layer shrinks.

Embodiments of a superjunction semiconductor device according to the present invention are described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and are not repeatedly described.

A superjunction semiconductor device 40 according to the present invention is configured using a wide band gap semiconductor. In a first embodiment, a silicon carbide semiconductor device fabricated (manufactured) using, for example, silicon carbide (SiC) as a wide band gap semiconductor is described taking a superjunction MOSFET as an example.

Figure 1:
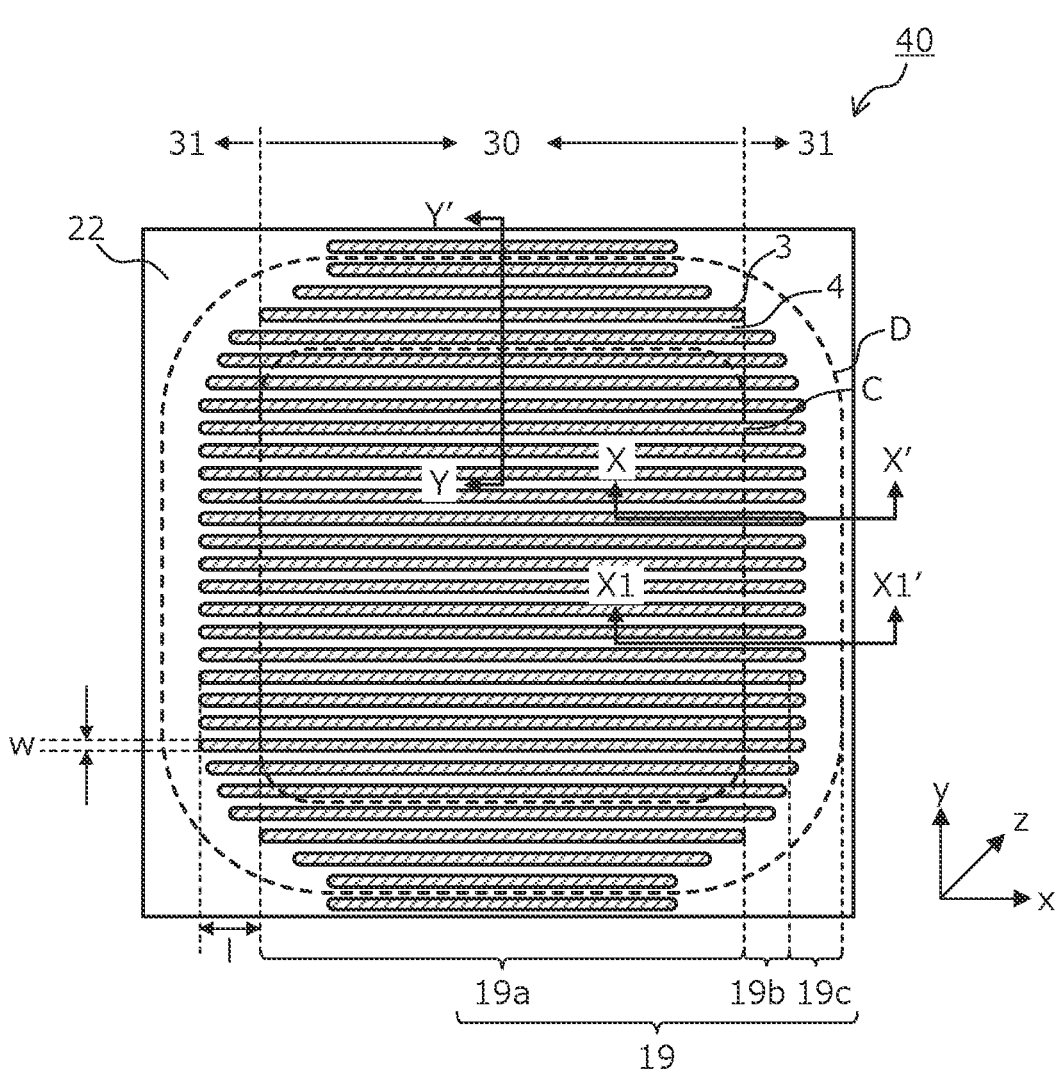
FIG. 1 is a plan view depicting a structure of a superjunction semiconductor device according to a first embodiment.

FIG. 1 is a plan view depicting a structure of the superjunction semiconductor device according to the first embodiment. As depicted in FIG. 1, the SJ-MOSFET 40 has an active region 30 and an edge termination region 31 that surrounds a periphery of the active region 30. In FIG. 1, a region surrounded by dotted line C is the active region 30, and a region between dotted line C and dotted line D is the edge termination region 31.

The SJ-MOSFET 40 has, in the active region 30 and the edge termination region 31, a parallel structure (hereinafter, parallel pn structure 19) in which p-type column regions 3 and n-type column regions 4 are arranged so as to repeatedly alternate with one another. In the parallel pn structure 19, an impurity amount contained by the p-type column regions 3 and an impurity amount contained by the n-type column regions 4 are substantially equal and charge is balanced, whereby in the off state, a pseudo non-doped layer is created, enabling facilitation of a high breakdown voltage.

Further, the parallel pn structure 19 is configured by an active-region parallel pn structure 19a, a first termination-region parallel pn structure 19b, and a second termination-region parallel pn structure 19c. The first termination-region parallel pn structure 19b, in a longitudinal direction (the x direction) of the p-type column regions 3 and the n-type column regions 4, is a portion of the parallel pn structure 19 adjacent to the active region 30; the second termination-region parallel pn structure 19c, in the longitudinal direction (the x direction), is a portion of the parallel pn structure 19 closest to a chip end.

Figure 2A:
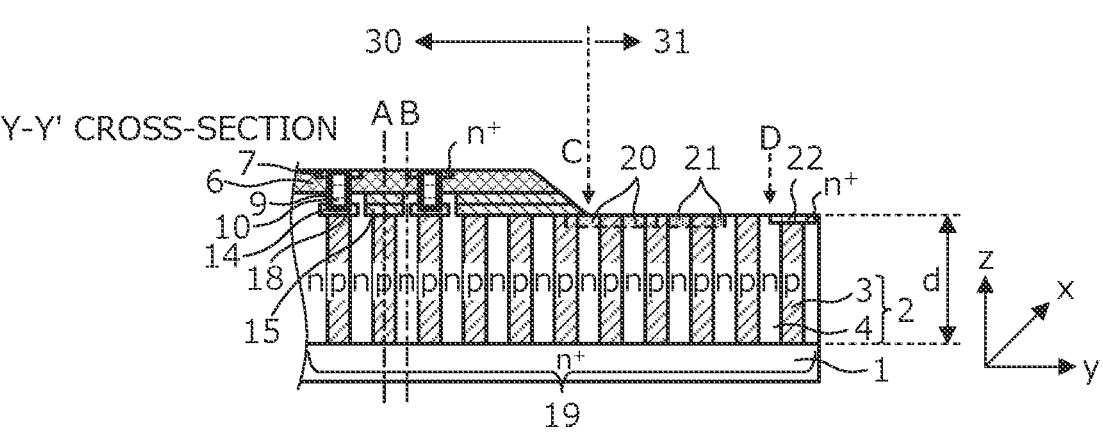
FIG. 2A is a cross-sectional view of the structure of the superjunction semiconductor device according to the first embodiment depicted in FIG. 1.
Figure 2B:
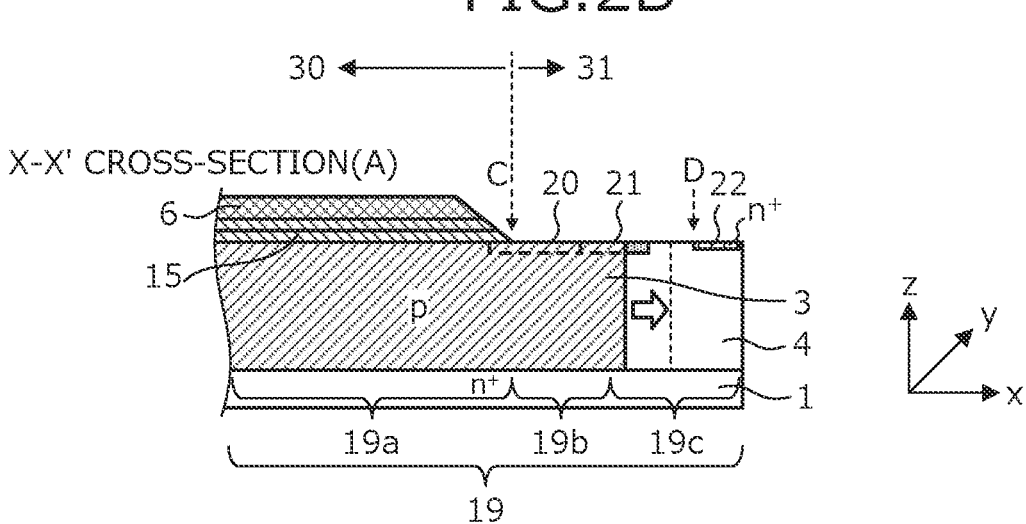
FIG. 2B is a cross-sectional view of the structure of the superjunction semiconductor device according to the first embodiment depicted in FIG. 1.
Figure 2C:
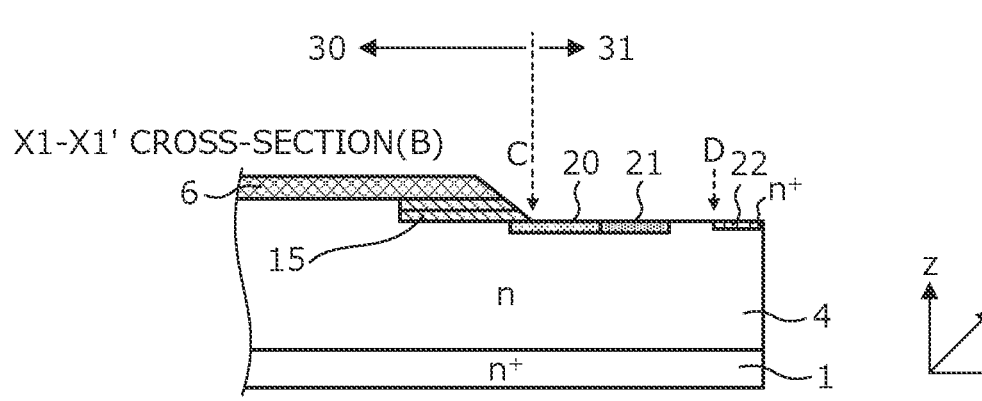
FIG. 2C is a cross-sectional view of the structure of the superjunction semiconductor device according to the first embodiment depicted in FIG. 1.
Figure 2C:
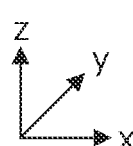

FIGS. 2A, 2B, and 2C are cross-sectional views of the structure of the superjunction semiconductor device according to the first embodiment depicted in FIG. 1. FIG. 2A is a cross-sectional view along Y-Y' in FIG. 1. FIG. 2B is a cross-sectional view along X-X' in FIG. 1. FIG. 2C is a cross-sectional view along X1-X1' in FIG. 1. Further, FIG. 2B is a cross-sectional view of portion A in FIG. 2A and FIG. 2C is a cross-sectional view of a portion B in FIG. 2A. In FIGS. 2A to 2C, reference characters C and D correspond to positions of dotted lines C and D in FIG. 1.

In FIGS. 2A to 2C, while a superjunction semiconductor device having only two unit cells (functional units of the device) is depicted, in the actual superjunction semiconductor device, more than two unit cells are provided. The superjunction semiconductor device 40 depicted in FIGS. 2A to 2C is a superjunction MOSFET in which, MOS gates are provided in a semiconductor wafer (silicon carbide wafer: semiconductor chip), at a front surface (surface having a p-type base region 6) thereof, the semiconductor wafer containing silicon carbide.

The silicon carbide wafer is formed by epitaxially growing, on a first main surface (front surface) of an n⁺-type semiconductor substrate (semiconductor substrate of a first conductivity type) 1, a silicon carbide layer that constitutes an n-type drift layer (first semiconductor layer) 2. The MOS gates are configured by a p-type base region (second semiconductor layer of a second conductivity type) 6, n⁺-type source regions (first semiconductor regions of the first conductivity type) 7, gate insulating films 9, and gate electrodes 10.

In the n-type drift layer 2, the parallel pn structure 19 is provided. The parallel pn structure 19 is formed by p-type column regions (second columns of the second conductivity type) 3 and n-type regions (the n-type column regions 4, first columns) sandwiched by the p-type column regions 3, the p-type column regions and the n-type column regions 4 repeatedly alternating with one another and are bonded to one another. The p-type column regions 3 penetrate through the n-type drift layer 2, from a bottom (surface facing the n⁺-type semiconductor substrate 1) of the p-type base region 6 and reach a surface of the n⁺-type semiconductor substrate 1. In a plan view, the p-type column regions 3 and the n-type column regions 4 each has a shape of a stripe (rectangular shape) as depicted in FIG. 1.

In the n-type drift layer 2, at a surface thereof facing ohmic electrodes, the p-type base region 6 is provided. In the silicon carbide wafer, at the first main surface (surface having the p-type base region 6) thereof, a trench structure is formed. In particular, the trenches 18 penetrate through the p-type base region 6, from a first surface (surface facing the first main surface of the silicon carbide wafer) of the p-type base region 6, opposite to a second surface thereof facing the n$^+$-type semiconductor substrate 1, and the trenches 18 reach the p-type column regions 3. Along inner walls of the trenches 18, the gate insulating films 9 are formed on the bottoms and sidewalls of the trenches 18, and the gate electrodes 10 are formed on the gate insulating films 9 in the trenches 18. The gate electrodes 10 are insulated from the n-type column regions 4 and the p-type base region 6 by the gate insulating films 9. A portion of each of the gate electrodes 10 may protrude toward the ohmic electrodes, from tops (ends at the first main surface) of the trenches 18.

First p$^+$-type base regions 14 may be provided beneath the trenches 18, respectively, and a width of each of the first p$^+$-type base regions 14 may be wider than a width of each of the trenches 18. In the parallel pn structure 19, at a first surface (surface facing the first main surface of the silicon carbide semiconductor wafer) thereof, opposite to a second surface thereof facing the n$^+$-type semiconductor substrate 1, second p$^+$-type base regions 15 may be selectively provided so as to be connected to the p-type base region 6. The first p$^+$-type base regions 14 and the second p$^+$-type base regions 15, for example, are doped with aluminum.

A depth of lower portions (portions facing the drain) of the first p$^+$-type base regions 14 and the second p$^+$-type base regions 15 may be variously changed according to design conditions and preferably, pn junctions between the first p$^+$-type base regions 14, the second p$^+$-type base regions 15 and the n-type column regions 4 may be closer to the drain than are the bottoms of the trenches 18. The first p$^+$-type base regions 14 and the second p$^+$-type base regions 15 may prevent application of high electric field to the gate insulating films 9 at portions along the bottoms of the trenches 18.

In the p-type base region 6, at the surface thereof facing the ohmic electrodes, the n$^+$-type source regions 7 are selectively provided. Further, p$^+$-type contact regions (not depicted) may be selectively provided. In this instance, the n$^+$-type source regions 7 and the p$^+$-type contact regions may be in contact with one another. A depth of the p$^+$-type contact regions, for example, may be shallower or deeper than the n$^+$-type source regions 7. Further, the p$^+$-type contact regions and the n$^+$-type source regions 7 are arranged in a longitudinal direction (x-axis direction) of the trenches 18.

An interlayer insulating film (not depicted) is provided in an entire area of the first main surface of the silicon carbide wafer, so as to cover the gate electrodes 10 embedded in the trenches 18. The ohmic electrodes (not depicted) are in contact with the n$^+$-type source regions 7 and the p-type base region 6, via contact holes opened in the interlayer insulating film. In an instance in which the p$^+$-type contact regions are provided, the ohmic electrodes are in contact with the n$^+$-type source regions 7 and the p$^+$-type contact regions. The ohmic electrodes are electrically insulated from the gate electrodes 10 by the interlayer insulating film. On the ohmic electrodes, a source electrode pad (not depicted) is provided. Between the ohmic electrodes and the interlayer insulating film, for example, a barrier metal (not depicted) that prevents diffusion of metal atoms from the ohmic electrodes to the gate electrodes 10 may be provided.

At the second main surface (back surface, i.e., back surface of the semiconductor wafer) of the n$^+$-type semiconductor substrate 1, a back electrode (not depicted) is provided. The back electrode constitutes a drain electrode.

Further, as depicted in FIGS. 2A to 2C, in the edge termination region 31, a junction termination extension (JTE) structure is provided. In an entire area of the edge termination region 31, the p-type base region 6 is removed, thereby forming a recess (recessed toward the drain) where in the edge termination region 31, the front surface of the silicon carbide wafer is lower than that in the active region 30 and exposing the parallel pn structure 19 at a bottom of the recess. Further, in the edge termination region 31, a first JTE region 20, a second JTE region 21 are provided as a JTE structure in which multiple p$^-$-type low-concentration regions (herein, two of a p$^-$-type and a p$^{--}$-type sequentially from closest to a chip center and indicated by reference numerals 20, 21) are disposed adjacently in descending order of impurity concentration in a direction from the chip center to the chip end. Further, an n$^+$-type region 22 that functions as a channel stopper is provided outside the second JTE region 21 (closer to the chip end than is the second JTE region 21). Instead of the JTE structure, a guard ring may be provided. In FIG. 2B, while the p-type column regions 3 terminate in a region corresponding to the second JTE region 21, the p-type column regions 3 may terminate between the second JTE region 21 and the n$^+$-type region 22 as indicated by the dotted line at the head of the block arrow in FIG. 2B.

In the first embodiment, a p-type impurity amount of the second termination-region parallel pn structure 19$c$ is lower than a p-type impurity amount in the active-region parallel pn structure 19$a$ and a p-type impurity amount of the first termination-region parallel pn structure 19$b$. The p-type impurity amount of the second termination-region parallel pn structure 19$c$ is a product obtained by multiplying a width w, a length l, a depth d, and a p-type impurity concentration of the p-type column regions 3 present of the second termination-region parallel pn structure 19$c$ (refer to FIGS. 1 and 2A). The p-type impurity amount in the active-region parallel pn structure 19$a$ and the p-type impurity amount of the first termination-region parallel pn structure 19$b$ are the same.

In FIG. 1, orthogonal to the direction in which the p-type column regions 3 and the n-type column regions 4 are arranged, i.e., in a longitudinal direction (the x direction) of the p-type column regions 3, the p-type column regions 3 of the second termination-region parallel pn structure 19$c$ are apart from the n$^+$-type region 22 (refer to FIGS. 2A to 2C), which functions as the channel stopper. The p-type impurity amount of the second termination-region parallel pn structure 19$c$ is lower than the p-type impurity amount in the active-region parallel pn structure 19$a$ and the p-type impurity amount of the first termination-region parallel pn structure 19$b$. In FIG. 1, the n$^+$-type region 22 is disposed so as to surround an outer side of dotted line D in the outer periphery of the edge termination region 31.

For example, ends of the p-type column regions 3 of the second termination-region parallel pn structure 19$c$ may be closer to the active region 30 than is an outer peripheral end of the second JTE region 21 (refer to FIG. 2B). Further, provided that the ends of the p-type column regions 3 of the second termination-region parallel pn structure 19$c$ do not reach the n$^+$-type region 22, said ends may be closer to the n$^+$-type region 22 than is the second JTE region 21.

Figure 3A:
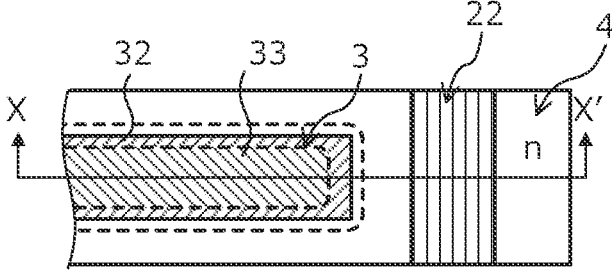
FIG. 3A is a view of a simulated edge termination region of the superjunction semiconductor device according to the first embodiment.
Figure 3B:
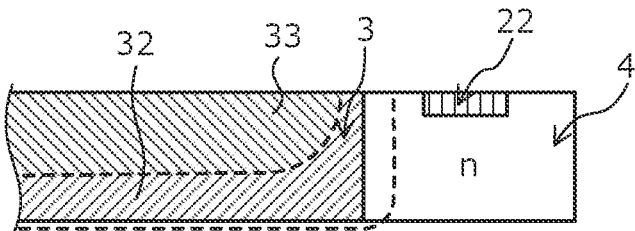
FIG. 3B is a view of the simulated edge termination region of the superjunction semiconductor device according to the first embodiment.

FIGS. 3A and 3B are views of a simulated edge termination region of the superjunction semiconductor device according to the first embodiment. FIG. 3A is a plan view depicting spreading of a depletion layer in the simulation of the low voltage (Vds1) in the edge termination region. FIG. 3B is a cross-sectional view along X-X' in FIG. 3A. As depicted in FIGS. 3A and 3B, by the low voltage Vds1, a source-drain voltage is applied to a depletion layer 32 that spreads from junctions between n-type regions (the n-type column regions 4), which are in contact with the channel stopper (the $n^+$-type region 22) of the drain potential, and the p-type column regions 3. The n-type column regions 4 are between the p-type column regions 3 and channel stopper and thus, the breakdown voltage between the channel stopper and the p-type column regions 3 increases.

Figure 4A:
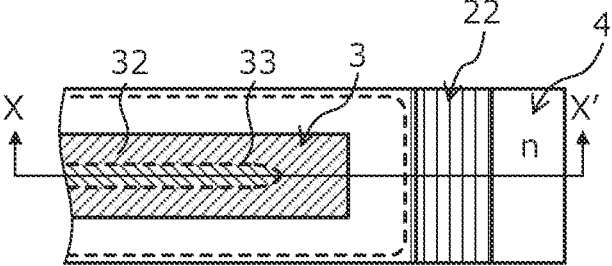
FIG. 4A is a view of a simulated edge termination region in the superjunction semiconductor device according to the first embodiment.
Figure 4B:
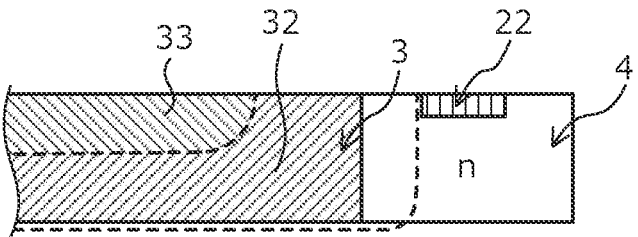
FIG. 4B is a view of the simulated edge termination region in the superjunction semiconductor device according to the first embodiment.

FIGS. 4A and 4B are views of a simulated edge termination region in the superjunction semiconductor device according to the first embodiment. FIG. 4A is a plan view depicting spreading of a depletion layer in the simulation of the intermediate voltage (Vds2) in the edge termination region. FIG. 4B is a cross-sectional view along X-X' in FIG. 4A. As depicted in FIGS. 4A and 4B, when Vds is increased, the depletion layer 32 at the p-type column regions 3 spreads and a distance between a neutral region 33 of each of the p-type column regions 3 and the channel stopper increases, whereby the electric field is mitigated.

FIGS. 5A and 5B are views of a simulated edge termination region in the superjunction semiconductor device according to the first embodiment. FIG. 5A is a plan view depicting spreading of a depletion layer in the simulation of the high voltage (Vds3) in the edge termination region. FIG. 5B is a cross-sectional view along X-X' in FIG. 5A. As depicted in FIGS. 5A and 5B, when the voltage is increased from Vds2 to Vds3, the neutral region 33 retreats sharply due to an effect of the SJ structure.

In this manner, the impurity amount (charge amount) of the p-type column regions 3 in the edge termination region 31 decreases on the drain potential side (channel stopper side) and an n-rich state occurs in the edge termination region 31. Thus, in the low voltage state (Vds1) in which the neutral region (region at the source potential) remains in the edge termination region 31, concentration of electric field at portions where the channel stopper and the p-type column regions 3 overlap may be prevented, electric field close to the channel stopper is mitigated, and decreases in the breakdown voltage of the edge termination region 31 may be prevented.

Next, a method of manufacturing the superjunction semiconductor device 40 according to the first embodiment is described. FIGS. 6A, 6B. 6C, and 6D are cross-sectional views depicting states of the superjunction semiconductor device according to the first embodiment during manufacture.

First, the $n^+$-type semiconductor substrate 1 containing an n-type single crystal 4H-SiC is prepared. Subsequently, on the surface of the $n^+$-type semiconductor substrate 1, a lower n-type drift layer 2a containing silicon carbide is epitaxially grown while an n-type impurity is doped. The state up to here is depicted in FIG. 6A. The substrate in which layers such as the lower n-type drift layer 2a are epitaxially grown on the $n^+$-type semiconductor substrate 1 containing a single crystal 4H-SiC is referred to as a single crystal 4H-SiC epitaxial substrate.

Next, on the surface of the lower n-type drift layer 2a, an ion implantation mask 34 having predetermined openings is formed by a photolithographic technique using, for example, an oxide film. Subsequently, a p-type impurity is implanted in the openings of the oxide film, thereby forming lower p-type column regions 3a. The lower p-type column regions 3a are formed so as to be apart from the $n^+$-type region 22 (not depicted), which functions as the channel stopper. The state up to here is depicted in FIG. 6B. Next, the ion implantation mask 34 is removed.

Figure 6C:
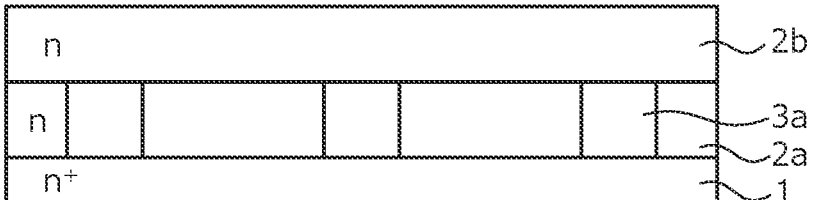
FIG. 6C is a cross-sectional view depicting a state of the superjunction semiconductor device according to the first embodiment during manufacture.
Figure 6D:
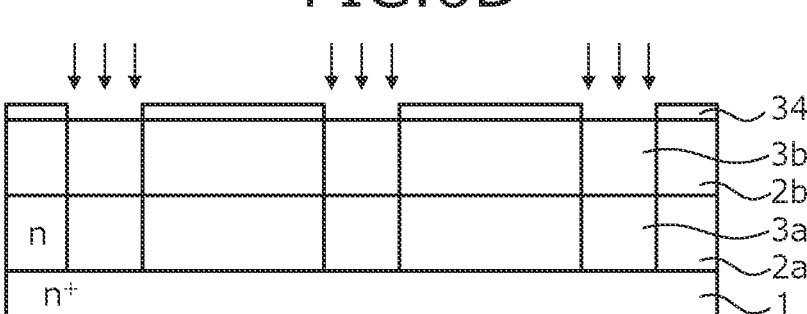
FIG. 6D is a cross-sectional view depicting a state of the superjunction semiconductor device according to the first embodiment during manufacture.

Next, on the surfaces of the lower n-type drift layer 2a and the lower p-type column regions 3a, an upper n-type drift layer 2b containing silicon carbide is epitaxially grown while an n-type impurity is doped. The state up to here is depicted in FIG. 6C. Next, on the surface of the upper n-type drift layer 2b formed, the ion implantation mask 34 having predetermined openings is formed by a photolithographic technique using, for example, an oxide film. Subsequently, a p-type impurity is implanted in the openings of the oxide film, thereby forming upper p-type column regions 3b. The upper p-type column regions 3b, similarly to the lower p-type column regions 3a, are formed so as to be apart from the $n^+$-type region 22 (not depicted), which functions as the channel stopper. The state up to here is depicted in FIG. 6D. Next, the ion implantation mask 34 is removed.

Next, processes of epitaxial growth in FIG. 6C and ion implantation in FIG. 6D are repeated a predetermined number of times, thereby forming the p-type column regions 3 and the n-type column regions 4. The lower p-type column regions 3a and the upper p-type column regions 3b constitute portions of the p-type column regions 3, and the lower n-type drift layer 2a and the upper n-type drift layer 2b constitute portions of the n-type column regions 4. Further, after the n-type column regions 4 are formed, a portion of each of the n-type column regions 4 may be inverted to form the first $p^+$-type base regions 14 (not depicted) and the second $p^+$-type base regions 15 (not depicted). While the method above is a so-called multistage epitaxial method, the method may be a so-called trench back-filling method in which trenches are formed in a drift region of one conductivity type and an epitaxial layer containing an impurity of another conductivity type is grown in the trenches.

Next, while figures sequentially depicting processes are omitted herein, as depicted in the cross-sectional view in FIG. 2A, on the surfaces of the p-type column regions 3 and the n-type column regions 4, the p-type base region 6 doped with a p-type impurity such as aluminum is formed. Next, by photolithography and etching, a recess is formed to a depth of, for example, 0.3 μm, at the surface of the p-type base region 6 in the edge termination region 31, whereby in the edge termination region 31, the p-type base region 6 is removed and the n-type drift layer 2 is exposed. Next, on the surface of the p-type base region 6, an ion implantation mask having predetermined openings formed by photolithography using, for example, a resist, an oxide film, a semiconductor film, or a stacked oxide film/semiconductor film structure. An n-type impurity such as phosphorus (P) is ion-implanted in the openings, whereby the $n^+$-type source regions 7 are formed in portions of the p-type base region 6, at the surface thereof. Next, the ion implantation mask used in forming the $n^+$-type source regions 7 is removed. Next, by a similar method, an ion implantation mask having a predetermined opening is formed, an n-type impurity is ion-implanted in a portion of the n-type drift layer 2, at the surface thereof, whereby the $n^+$-type region 22 is formed. Next, the ion implantation mask used in forming the $n^+$-type region 22 is removed. The $n^+$-type region 22 may be formed concurrently with the $n^+$-type source regions 7 using the same mask.

Next, by a similar method, an ion implantation mask having predetermined openings is formed, a p-type impurity such as aluminum is ion-implanted in portions of the p-type base region 6, at the surface thereof, whereby the $p^+$-type contact regions may be formed. An impurity concentration of the $p^+$-type contact regions is set so to be higher than an impurity concentration of the p-type base region 6. Next, on the recess of the edge termination region 31 and the surface of the n-type drift layer 2, an ion implantation mask having predetermined openings is formed by photolithography using, for example, an oxide film. A p-type impurity is ion-implanted in the openings, whereby the first JTE region 20 and the second JTE region 21 are formed in portions of the recess and the n-type drift layer 2, at the surfaces thereof. Next, the ion implantation mask used in forming the first JTE region 20 and the second JTE region 21 is removed.

Next, a heat treatment (annealing) under an inert gas atmosphere of about 1700 degrees C. is performed, thereby implementing an activation process of the p-type column regions 3, the n⁺-type source regions 7, the p⁺-type contact regions, etc. As described, ion implanted regions may be activated collectively by a single heat treatment or may be activated by performing the heat treatment each time ion implantation is performed.

Next, on the surface of the p-type base region 6, a trench formation mask having predetermined openings is formed by photolithography using, for example, an oxide film. Next, by dry etching, the trenches 18 that penetrate through the p-type base region 6 and reach the n-type column regions 4 are formed. The bottoms of the trenches 18 may reach the first p⁺-type base regions 14 formed in the n-type column regions 4. Next, the trench formation mask is removed.

Before the trench formation mask is removed, that is, with the trench formation mask in place, isotropic etching for removing damage of the trenches 18, a heat treatment or sacrificial oxidation for rounding the bottoms of the trenches 18 and the openings of the trenches 18 may be performed. Any one of the isotropic etching and the sacrificial oxidation alone may be performed. Further, the sacrificial oxidation may be performed after the isotropic etching is performed. The trench formation mask may be removed concurrently with the oxidation film formed by the sacrificial oxidation.

Next, along the surfaces of the n⁺-type source regions 7 and the bottoms and the sidewalls of the trenches 18, the gate insulating films 9 are formed. The gate insulating films 9 may be formed by thermal oxidation of a temperature of about 1000 degrees C. under an oxygen atmosphere. Further, the gate insulating films 9 may be formed by a deposition method by a chemical reaction such as that for a high temperature oxide (HTO).

In an instance of formation by thermal oxidation, by a heat treatment (post oxidation annealing (POA) treatment), interface state density of interfaces between the gate insulating films 9 and semiconductor portions may be reduced. In an instance in which the gate insulating films 9 are formed by a deposition method such as that for a HTO, to decrease leakage current and enhance relative permittivity, post deposition annealing (PDA) may be performed.

Next, on the gate insulating films 9, a polycrystal silicon layer doped with, for example, phosphorus atoms is provided. The polycrystal silicon layer may be formed so as to be embedded in the trenches 18. The polycrystal silicon layer is etched by photolithography and left in the trenches 18, whereby the gate electrodes 10 are formed.

Next, for example, a phosphate glass is deposited to have a thickness of about 1 μm and so as to cover the gate insulating films 9 and the gate electrodes 10, whereby the interlayer insulating film (not depicted) is formed. Next, the barrier metal (not depicted) containing titanium (Ti) or titanium nitride (TiN) may be formed so as to cover the interlayer insulating film. The interlayer insulating film and the gate insulating films 9 are patterned by photolithography, thereby forming contact holes in which the n⁺-type source regions 7 are exposed. In an instance in which the p⁺-type contact regions are formed, contact holes that expose the n⁺-type source regions 7 and the p⁺-type contact regions are formed. Thereafter, a heat treatment (reflow) is performed, thereby planarizing the interlayer insulating film.

Next, in the contact holes and on the interlayer insulating film, a conductive film constituting the ohmic electrodes (not depicted) is provided. The conductive film is selectively removed, leaving portions constituting the ohmic electrodes in the contact holes, and the n⁺-type source regions 7 and the ohmic electrodes are in contact with one another. In an instance in which the p⁺-type contact regions are formed, the n⁺-type source regions 7 and the p⁺-type contact regions are in contact with the ohmic electrodes. Next, ohmic electrodes outside of the contact holes are removed.

Next, for example, by a sputtering method, on the ohmic electrodes at the front surface of the silicon carbide semiconductor wafer and on an upper portion of the interlayer insulating film, an electrode pad constituting the source electrode pad (not depicted) is deposited.

Next, a back electrode (not depicted) containing, for example, nickel is provided on the second main surface of the n⁺-type semiconductor substrate 1. Thereafter, a heat treatment under an inert gas atmosphere of about 1000 degrees C. is performed, whereby the back electrode is formed in ohmic contact with the n⁺-type semiconductor substrate 1. In an instance in which the trenches 18 are omitted, in portions of the p-type base region 6, at the surface thereof, n-type well regions are formed, the front surface of the silicon carbide semiconductor wafer is thermally oxidized, the gate insulating films 9 are formed, the p-type base region 6 and regions formed in the p-type base region 6, at the surface thereof are covered by the gate insulating films 9, and on the gate insulating films 9, the polycrystal silicon layer is formed as the gate electrodes 10, the polycrystal silicon layer is patterned and selectively removed, leaving portions of the polycrystal silicon layer on portions sandwiched between the n-type well regions and the n⁺-type source regions 7 of the p-type base region 6, whereby the interlayer insulating film is formed so as to cover the gate electrodes 10.

In the epitaxial growth and the ion implantation described above, as an n-type impurity (n-type dopant), for example, nitrogen (N), phosphorus (P), arsenic (As), antimony (Sb), or the like that are an n-type with respect to silicon carbide may be used. As a p-type impurity (p-type dopant), for example, boron (B), aluminum (Al), gallium (Ga), indium (In), thallium (Tl), or the like that are a p-type with respect to silicon carbide may be used. In this manner, the silicon carbide semiconductor device depicted in FIGS. 1 to 2C is completed.

As described above, according to the first embodiment, the p-type column regions in a termination-region second parallel pn structure are apart from the n⁺-type region (channel stopper), whereby the p-type impurity amount of the termination-region second parallel pn structure is less than the p-type impurity amount in an active-region parallel pn structure and that in a termination-region first parallel pn structure. As a result, in a low voltage state in which neutral regions remain in the p-type columns of the edge termination region, the concentration of electric field at portions where the channel stopper and the p-type column regions overlap may be prevented, electric field close to the channel stopper is mitigated, and decreases in the breakdown voltage in the edge termination region may be prevented.

Figure 7:
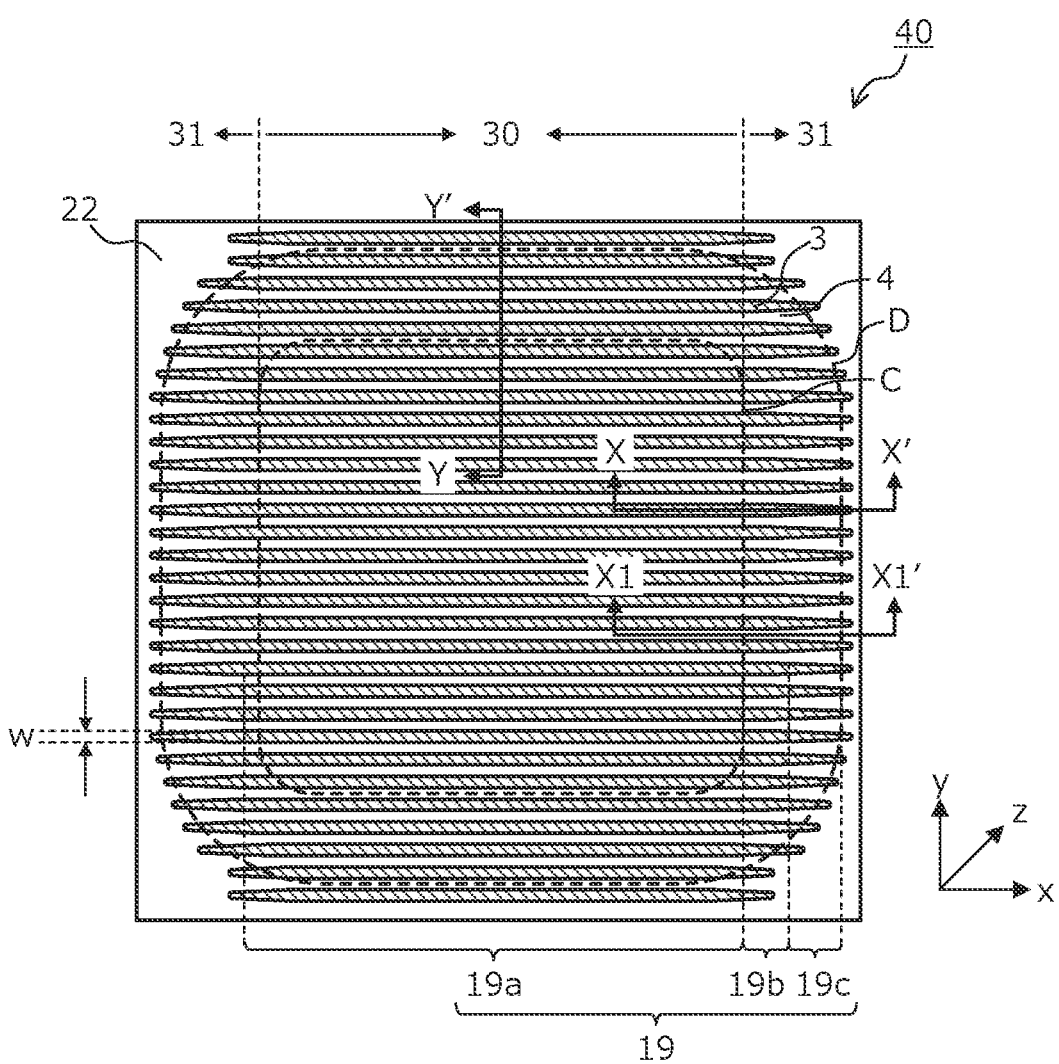
FIG. 7 is a plan view depicting a structure of a super-junction semiconductor device according to a second embodiment.
Figure 8A:
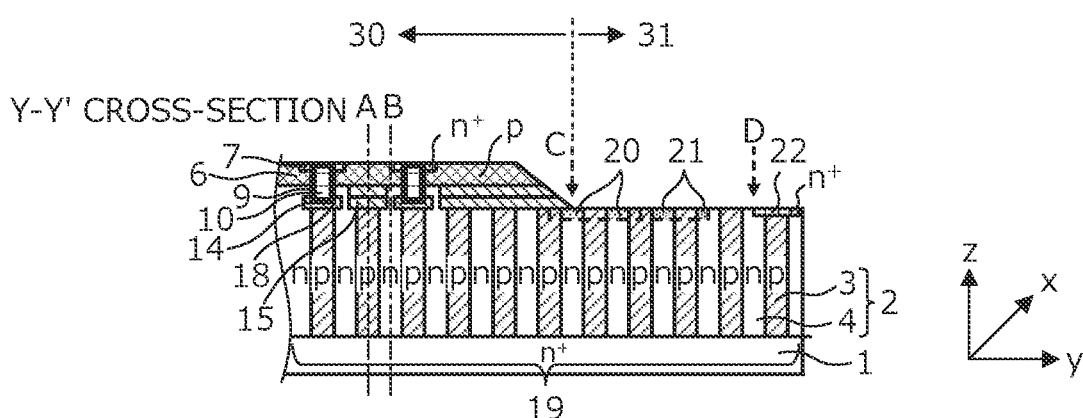
FIG. 8A is a cross-sectional view of the structure of the superjunction semiconductor device according to the second embodiment in FIG. 7.

FIG. 7 is a plan view depicting a structure of a superjunction semiconductor device according to a second embodiment. Further, FIGS. 8A, 8B, and 8C are cross-sectional views of the structure of the superjunction semiconductor device according to the second embodiment in FIG. 7. FIG. 8A is a cross-sectional view along Y-Y' in FIG.

7. Further, FIG. 8B is a cross-sectional view along X-X' in FIG. 7. Further, FIG. 8C is a cross-sectional view along X1-X1' in FIG. 7.

As depicted in FIG. 7, in the second embodiment, in the longitudinal direction (the x direction) of the p-type column regions 3, orthogonal to the direction in which the p-type column regions 3 and the n-type column regions 4 are arranged, the width w of each of the p-type column regions 3 decreases in portions thereof close to the chip end. As a result, the impurity amount of the p-type column regions 3 in the edge termination region 31 is less than that of the drain potential side (side having the n⁺-type region 22 that functions as a channel stopper). Thus, similarly to the first embodiment, in a low voltage state in which the neutral regions (regions at the source potential) remain in the edge termination region 31, the concentration of electric field at portions where the channel stopper (the n⁺-type region 22) and the p-type column regions 3 overlap may be prevented, electric field close to the channel stopper (the n⁺-type region 22) is mitigated, and decreases in the breakdown voltage in the edge termination region 31 may be prevented.

Figure 9B:
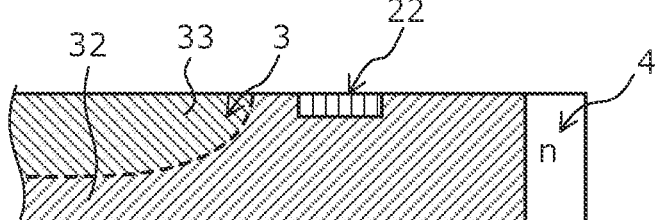
FIG. 9B is a view of the simulated edge termination region in the superjunction semiconductor device according to the second embodiment.

FIGS. 9A and 9b are views of a simulated edge termination region in the superjunction semiconductor device according to the second embodiment. FIG. 9A is a plan view depicting spreading of a depletion layer in the simulation of the low voltage (Vds1) in the edge termination region. FIG. 9B is a cross-sectional view along X-X' in FIG. 9A. As depicted in FIGS. 9A and 9B, the impurity amount of ends of the p-type column regions 3 is low and thus, by Vds1, the depletion layer 32 that is already spreading from junctions between the p-type column regions 3 and the n-type column regions 4 is continuous with the depletion layer 32 that spreads from junctions between the channel stopper and the p-type column regions 3.

Figure 10A:
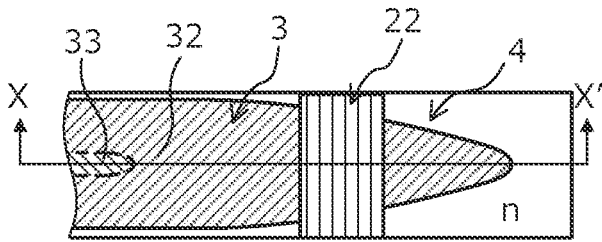
FIG. 10A is a view of a simulated edge termination region in the superjunction semiconductor device according to the second embodiment.
Figure 10B:
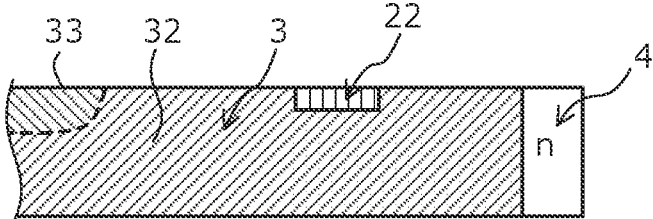
FIG. 10B is a view of the simulated edge termination region in the superjunction semiconductor device according to the second embodiment.

FIGS. 10A and 10B are views of a simulated edge termination region in the superjunction semiconductor device according to the second embodiment. FIG. 10A is a plan view depicting spreading of a depletion layer in the simulation of the intermediate voltage (Vds2) in the edge termination region. FIG. 10B is a cross-sectional view along X-X' in FIG. 10A. As depicted in FIGS. 10A and 10B when Vds is further increased, the end of the depletion layer 32 is apart from the channel stopper and thus, electric field strength between the neutral region 33 of the source potential and the channel stopper of the drain potential does not increase and thus, breakdown by a low voltage does not occur.

Figure 11A:
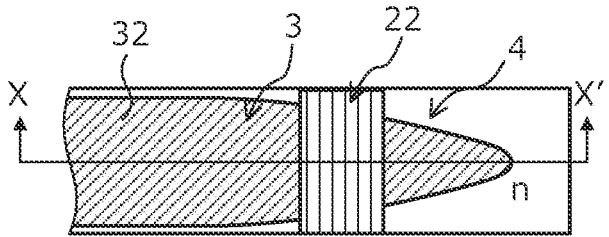
FIG. 11A is a view of a simulated structure of the edge termination region in the superjunction semiconductor device according to the second embodiment.
Figure 11B:
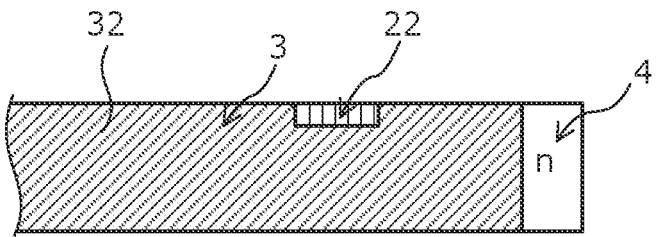
FIG. 11B is a view of the simulated structure of the edge termination region in the superjunction semiconductor device according to the second embodiment.

FIGS. 11A and 11B are views of a simulated structure of the edge termination region in the superjunction semiconductor device according to the second embodiment. FIG. 11A is a plan view depicting spreading of a depletion layer in the simulation of the high voltage (Vds3) in the edge termination region. FIG. 11B is a cross-sectional view along X-X' in FIG. 11A. As depicted in FIGS. 11A and 11B, when the voltage is increased from Vds2 to Vds3, the neutral region 33 retreats sharply due to an effect of the SJ structure.

A method of manufacturing the superjunction semiconductor device 40 according to the second embodiment may be implemented by forming the p-type column regions 3 to a region beneath the n⁺-type region 22, which functions as the channel stopper, and in the longitudinal direction of the p-type column regions 3, gradually reducing the width of each of the p-type column regions 3 with increasing proximity thereof to the chip end, in the method of manufacturing the superjunction semiconductor device 40 according to the first embodiment.

As described above, according to the second embodiment, in the longitudinal direction of the p-type column regions, the width of each of the p-type column regions gradually decreases with increasing proximity to the chip end. As a result, the p-type impurity amount in the termination-region second parallel pn structure is lower than the p-type impurity amount in the active-region parallel pn structure and the p-type impurity amount in the termination-region first parallel pn structure. Thus, effects similar to those of the first embodiment may be obtained.

Figure 12:
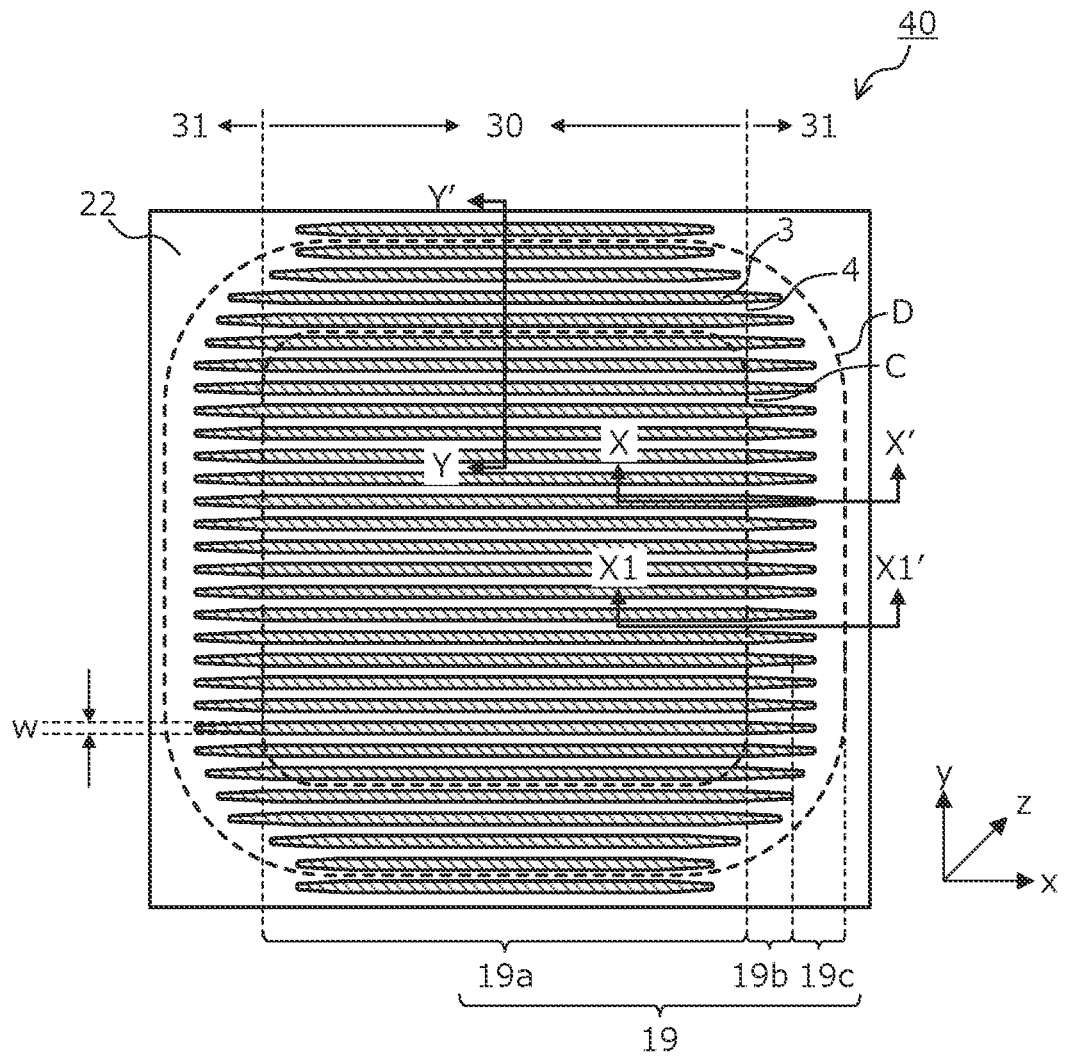
FIG. 12 is a plan view depicting a structure of a super-junction semiconductor device according to a third embodiment.
Figure 13A:
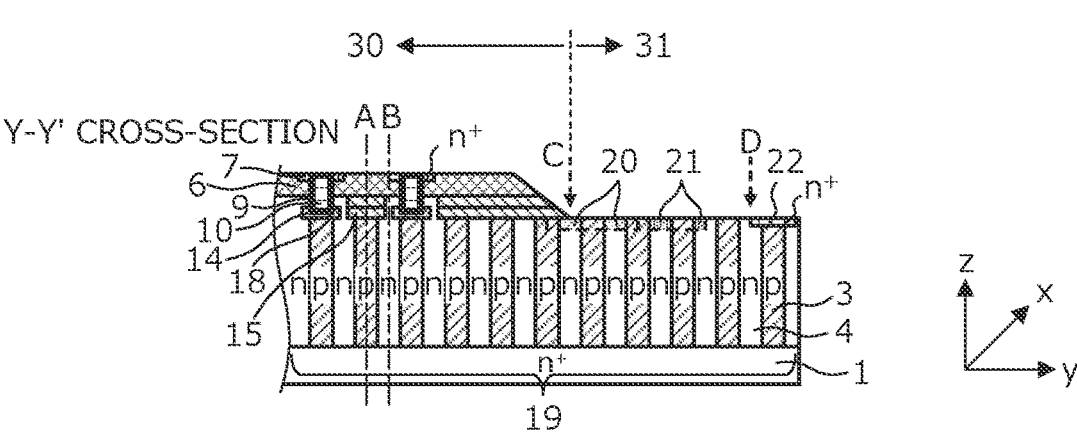
FIG. 13A is a cross-sectional view depicting the structure of the superjunction semiconductor device according to the third embodiment.
Figure 13B:
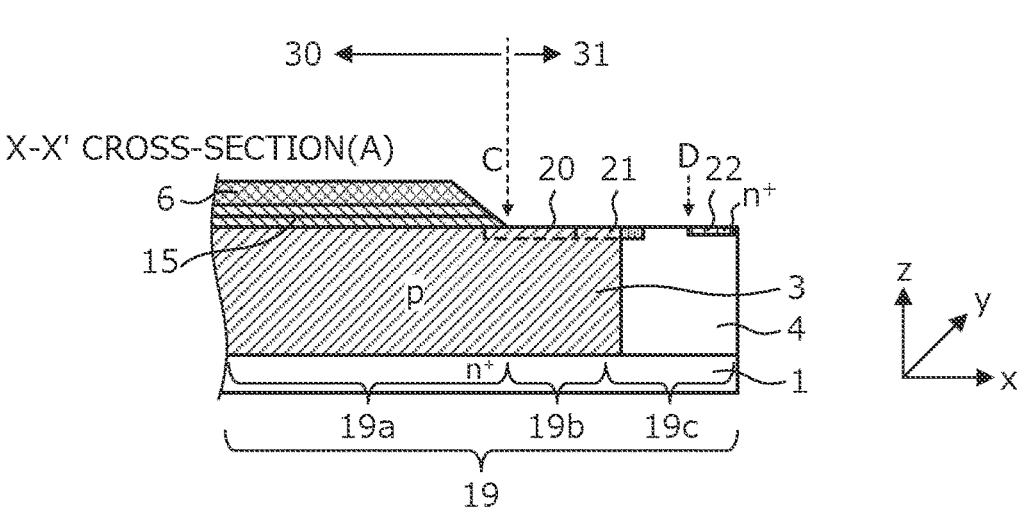
FIG. 13B is a cross-sectional view depicting the structure of the superjunction semiconductor device according to the third embodiment.
Figure 13C:
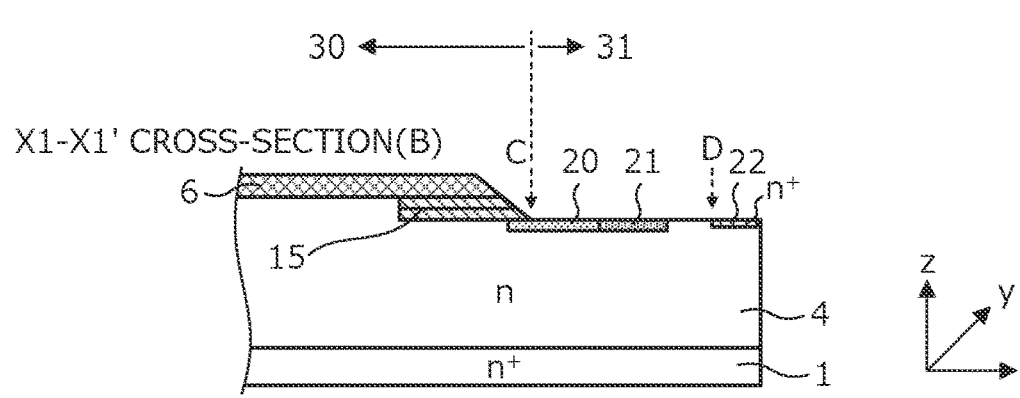
FIG. 13C is a cross-sectional view depicting the structure of the superjunction semiconductor device according to the third embodiment.

FIG. 12 is a plan view depicting a structure of a super-junction semiconductor device according to a third embodiment. FIGS. 13A, 13B, and 13C are cross-sectional views depicting the structure of the superjunction semiconductor device according to the third embodiment. FIG. 13A is a cross-sectional view along Y-Y' in FIG. 12. FIG. 13B is a cross-sectional view along X-X' in FIG. 12. FIG. 13C is a cross-sectional view along X1-X1' in FIG. 12.

As depicted in FIGS. 12A to 12C, in the third embodiment, in the longitudinal direction of the p-type column regions 3, the p-type column regions 3 of the second termination-region parallel pn structure 19c are apart from the n⁺-type region 22, which functions as the channel stopper, and the width w of each of the p-type column regions 3 gradually decreases with increasing proximity thereof to the chip end in the longitudinal direction of the p-type column regions 3. In other words, features of both the first embodiment and the second embodiment are provided.

As a result, similarly to the first embodiment and the second embodiment, in a low voltage state in which a neutral region (region at the source potential) remains in the edge termination region 31, the concentration of electric field at portions where the channel stopper (the n⁺-type region 22) and the p-type column regions 3 overlap may be prevented, electric field close to the channel stopper (the n⁺-type region 22) is mitigated, and decreases in the breakdown voltage in the edge termination region 31 may be prevented.

A method of manufacturing the superjunction semiconductor device 40 according to the third embodiment may be implemented by forming the p-type column regions 3 to be apart from the n⁺-type region 22 in the longitudinal direction of the p-type column regions 3 (the n⁺-type region 22 functioning as the channel stopper) and in the longitudinal direction of the p-type column regions 3, gradually decreasing the width of each of the p-type column regions 3 with increasing proximity thereof to the chip end, in the method of manufacturing the superjunction semiconductor device 40 according to the first embodiment.

As described above, according to the third embodiment, in the longitudinal direction of the p-type column regions, the p-type column regions in the termination-region second parallel pn structure are apart from the n⁺-type region, which functions as the channel stopper, and in the longitudinal direction of the p-type column regions, the width of each of the p-type column regions gradually decreases with increasing proximity thereof to the chip end. As a result, the p-type impurity amount in the termination-region second parallel pn structure is lower than the p-type impurity amount in active-region parallel pn structure and the p-type impurity amount in the termination-region first parallel pn structure. Thus, effects similar to those of the first embodiment and the second embodiment may be obtained.

Figure 14A:
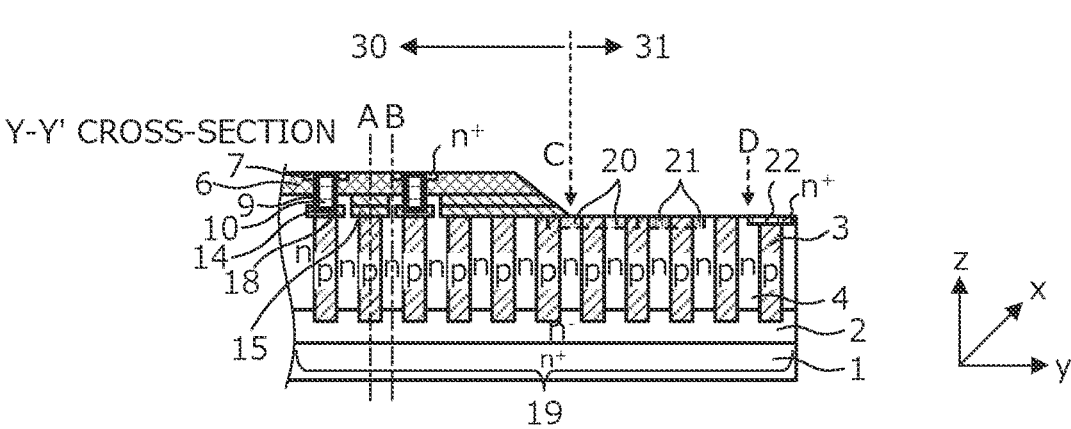
FIG. 14A is a cross-sectional view depicting the structure of the superjunction semiconductor device according to a fourth embodiment.
Figure 14B:
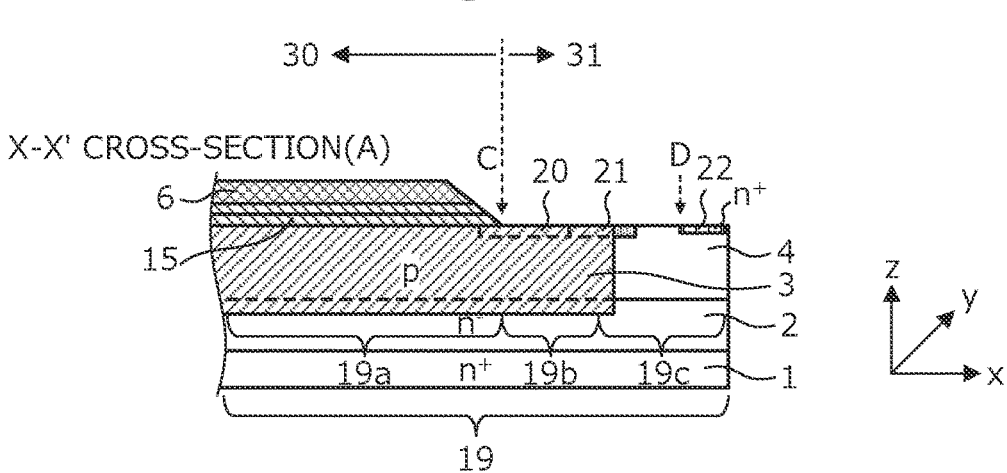
FIG. 14B is a cross-sectional view depicting the structure of the superjunction semiconductor device according to the fourth embodiment.
Figure 14C:
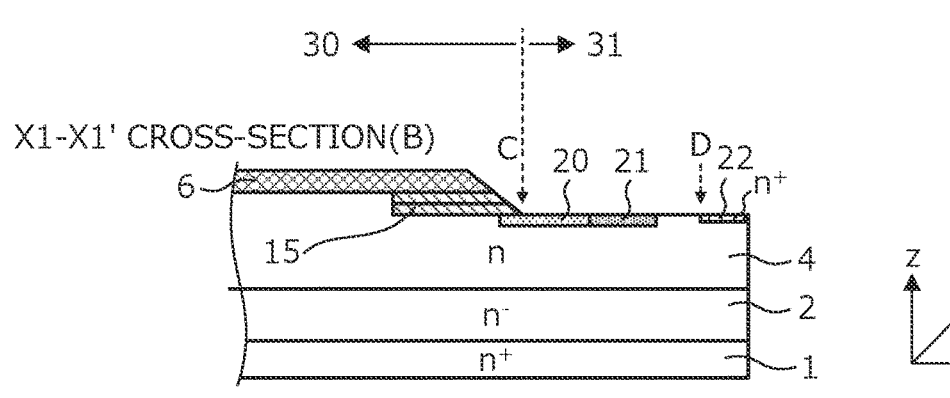
FIG. 14C is a cross-sectional view depicting the structure of the superjunction semiconductor device according to the fourth embodiment.

A plan view of a structure of a superjunction semiconductor device according to a fourth embodiment is the same as that depicted in FIG. 12 and thus, depiction thereof is omitted herein. FIGS. 14A, 14B, and 14C are cross-sectional views depicting the structure of the superjunction semiconductor device according to the fourth embodiment. FIG. 14A is a cross-sectional view along Y-Y' in FIG. 12. FIG. 14B is a cross-sectional view along X-X' in FIG. 12. FIG. 14C is a cross-sectional view along X1-X1' in FIG. 12.

As depicted in FIGS. 14A to 14C, in the fourth embodiment, the p-type column regions 3 and the n-type column regions 4 do not reach the n⁺-type semiconductor substrate 1 and form a so-called semi-SJ structure. Thus, the n-type drift layer 2 is present between the parallel pn structure 19 and the n⁺-type semiconductor substrate 1 as well. In the fourth embodiment, similarly to the third embodiment, in the longitudinal direction of the p-type column regions 3, the p-type column regions 3 of the second termination-region parallel pn structure 19c are apart from the n⁺-type region 22, which functions as the channel stopper, and in the longitudinal direction of the p-type column regions 3, the width of each of the p-type column regions 3 gradually decreases with increasing proximity thereof to the chip end.

As a result, similarly to the third embodiment, in a low voltage state in which a neutral region (region at the source potential) remains in the edge termination region 31, the concentration of electric field at portions where the channel stopper and the p-type column regions 3 overlap may be prevented, electric field close to the channel stopper is mitigated, and decreases in the breakdown voltage of the edge termination region 31 may be prevented.

A method of manufacturing the superjunction semiconductor device 40 according to the fourth embodiment may be implemented by forming the p-type column regions 3 and the n-type column regions 4 to not reach the n⁺-type semiconductor substrate 1, in the method of manufacturing the superjunction semiconductor device 40 according to the third embodiment.

As described above, according to the fourth embodiment, the p-type column regions and the n-type column regions do not reach the n⁺-type semiconductor substrate 1. Even with this configuration of the SJ structure, effects similar to those of the third embodiment may be obtained.

Further, a structure similar to that of the conventional superjunction semiconductor device may be adopted and in the longitudinal direction (the x direction) of the p-type column regions 3, the impurity concentration of the p-type column regions 3 of the second termination-region parallel pn structure 19c may decrease in a direction to the chip end. As a result, the impurity amount of the p-type column regions 3 in the edge termination region 31 is lower closer to the drain potential side (channel stopper side).

In this instance as well, effects similar to those of the first to fourth embodiments described above are obtained. Further, in the first to fourth embodiments, the impurity concentration of the p-type column regions 3 may decrease with increasing proximity to the chip end.

Figure 15A:
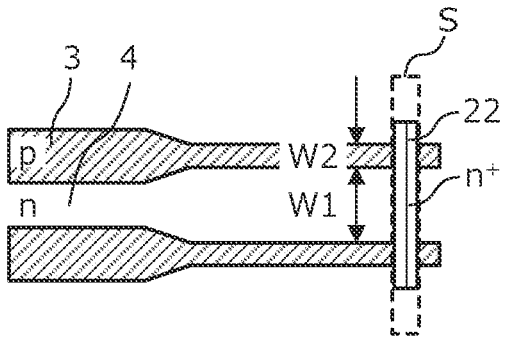
FIG. 15A is a top view depicting ends of p-type column regions in a longitudinal direction, set to simulate a super-junction semiconductor device according to a fifth embodiment, similarly to the simulations in FIGS. 3 to 5 and FIGS. 9 to 11.
Figure 15A:
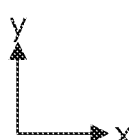
Figure 15B:
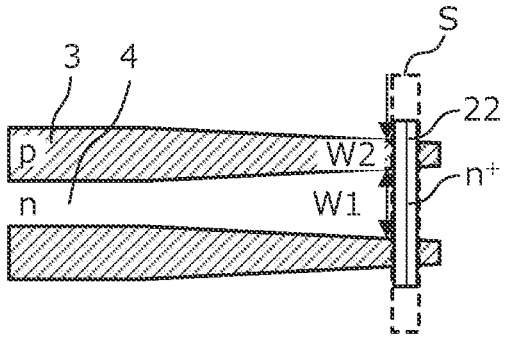
FIG. 15B is a top view depicting the ends of the p-type column regions in the longitudinal direction, set to simulate the superjunction semiconductor device according to the fifth embodiment, similarly to the simulations in FIGS. 3 to 5 and FIGS. 9 to 11.
Figure 15B:
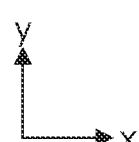
Figure 15C:
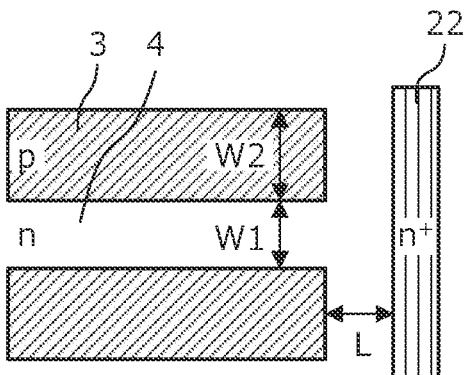
FIG. 15C is a top view depicting the ends of the p-type column regions in the longitudinal direction, set to simulate the superjunction semiconductor device according to the fifth embodiment, similarly to the simulations in FIGS. 3 to 5 and FIGS. 9 to 11.
Figure 15C:
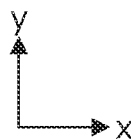

FIGS. 15A, 15B, and 15C are top views depicting ends of the p-type column regions in the longitudinal direction, set to simulate a superjunction semiconductor device according to a fifth embodiment, similarly to the simulations in FIGS. 3 to 5 and FIGS. 9 to 11. In the fifth embodiment, in the longitudinal direction (the x direction) of the n-type column regions 4 and the p-type column regions 3, the parallel pn structure 19 has a region S that is n-rich and in contact with the n⁺-type region 22. In other words, in the region S, a product obtained by multiplying the width of the n-type column regions 4 and the impurity concentration of the n-type column regions 4 is greater than a product obtained by multiplying the width of the p-type column regions 3 and the impurity concentration of the p-type column regions 3.

For example, as depicted in FIG. 15A, the impurity concentration of the n-type column regions 4 and the impurity concentration of the p-type column regions 3 may be set to be the same and in a vicinity of the region S where the parallel pn structure 19 is in contact with the n⁺-type region 22, a width W2 of each of the p-type column regions 3 may be less than a width W1 of each of the n-type column regions 4. Further, as depicted in FIG. 15B, the impurity concentration of the n-type column regions 4 and the impurity concentration of the p-type column regions 3 may be set to be the same and with increasing proximity to the region S where the parallel pn structure 19 is in contact with the n⁺-type region 22, the width W2 of each of the p-type column regions 3 may be monotonically reduced. Further, the width W2 of each of the p-type column regions 3 and the width W1 of each of the n-type column regions 4 may be set to be the same and the impurity concentration of the n-type column regions 4 may be set to be higher than the impurity concentration of the p-type column regions 3. Further, electric field particularly concentrates at locations where the p-type column regions 3 close to the surface and the n⁺-type region 22 of a high concentration are in contact with one another and thus, only locations close to the surface of the region S in contact with the n⁺-type region 22 may be set to be n-rich.

Further, in the fifth embodiment, as depicted in FIG. 15C, the p-type column regions 3 of the parallel pn structure 19 may be provided a distance L from the n⁺-type region 22 in the longitudinal direction of the p-type column regions 3. In this instance, in a vicinity of the n⁺-type region 22 in the edge termination region 31, a greater is the distance L, a higher is the n-rich state. By increasing the distance L, a p-rich state similarly to the active region may be set at the ends of the p-type column regions 3 of the parallel pn structure 19 in the longitudinal direction thereof. Thus, in the longitudinal direction of the p-type column regions 3 and the longitudinal direction of the n-type column regions 4, without changing the respective widths and impurity concentrations thereof, an instance similar to the active region may be set.

Thus, as depicted in FIG. 15C, when the p-type column regions 3 of the parallel pn structure 19 is apart from the n⁺-type region 22 by the distance L in the longitudinal direction of the p-type column regions 3, and the impurity concentration of the n-type column regions 4 and the impurity concentration of the p-type column regions 3 are the same, the width W2 of each of the p-type column regions 3 may be equal to or wider than the width W1 of each of the n-type column regions 4 along an entire length of the p-type column regions 3 in the longitudinal direction thereto. Further, the width W2 of each of the p-type column regions 3 and the width W1 of each of the n-type column regions 4 may be set to be the same and the impurity concentration of the n-type column regions 4 may be set to be equal to or lower than the impurity concentration of the p-type column regions 3. Further, electric field particularly concentrates at locations where the p-type column regions 3 close to the surface and the n⁺-type region 22 of a high concentration are in contact with one another and thus, configuration may be such that only at locations close to the surface, the p-type column regions 3 are provided apart from the n⁺-type region 22 by the distance L.

FIGS. 16A, 16B, 16C, and 16D are graphs depicting decreases in the breakdown voltage at a high temperature in an instance of the structure depicted in FIG. 15C for the SJ-SiC MOSFET of a breakdown voltage class of 1200V. In FIGS. 16A, 16B, 16C, and 16D, a vertical axis indicates drain-source current IDS in units of A. A horizontal axis indicates drain-source voltage $V_{DS}$ in units of V. FIGS. 16A, 16B, 16C, and 16D depict decreases in the breakdown voltage at room temperature (RT) and a high temperature (175 degrees), when $V_{GS}$ of the SiC MOSFET having a semi-SJ structure and a cell pitch of 5 μm is 0V, the parallel pn structure 19 is n-rich or p-rich.

Figure 16A:
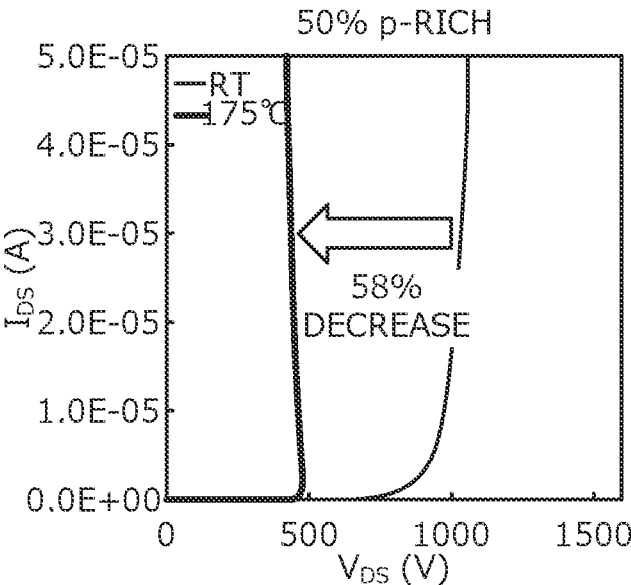
FIG. 16A is a graph depicting decreases in the breakdown voltage at a high temperature in an instance of the structure depicted in FIG. 15C for the SJ-SiC MOSFET of a break-down voltage class of 1200V.
Figure 16B:
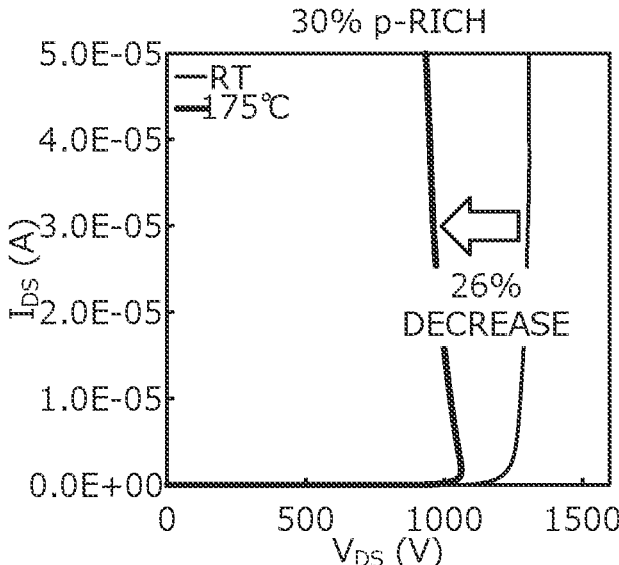
FIG. 16B is a graph depicting decreases in the breakdown voltage at the high temperature in an instance of the structure depicted in FIG. 15C for the SJ-SiC MOSFET of a break-down voltage class of 1200V.
Figure 16C:
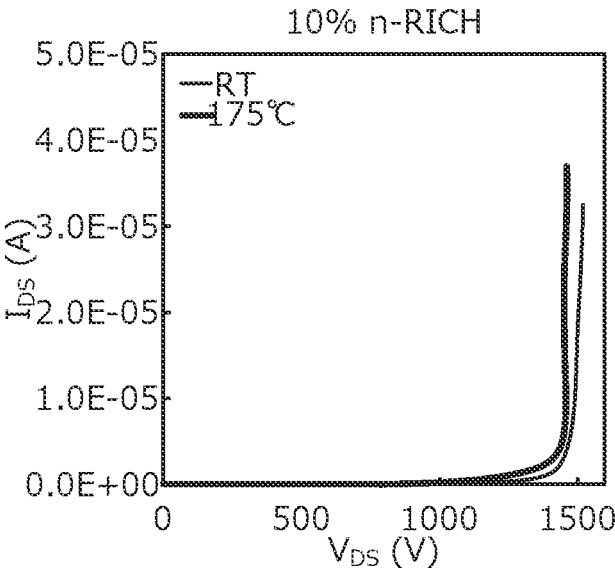
FIG. 16C is a graph depicting decreases in the breakdown voltage at the high temperature in an instance of the structure depicted in FIG. 15C for the SJ-SiC MOSFET of a break-down voltage class of 1200V.
Figure 16D:
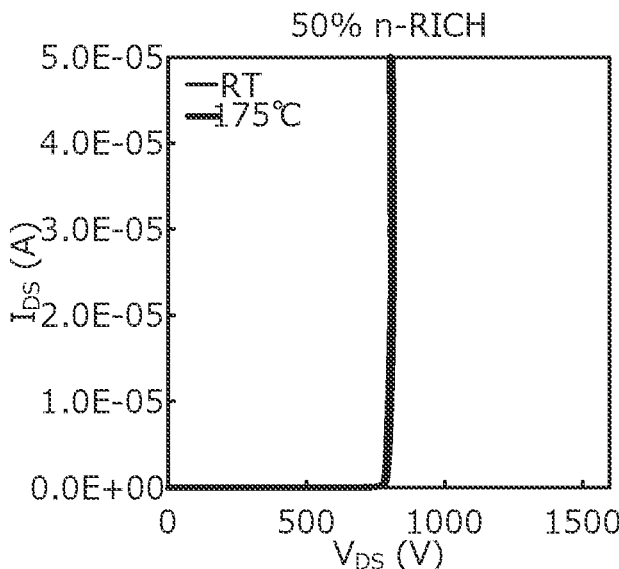
FIG. 16D is a graph depicting decreases in the breakdown voltage at the high temperature in an instance of the structure depicted in FIG. 15C for the SJ-SiC MOSFET of a break-down voltage class of 1200V.

FIG. 16A depicts an instance when 50% p-rich is set, FIG. 16B depicts an instance when 30% p-rich is set; FIG. 16C depicts an instance when 10% n-rich is set; and FIG. 16D depicts an instance when 50% n-rich is set. Here, 50% p-rich indicates that a product obtained by multiplying the width of the p-type column regions 3 and the impurity concentration of the p-type column regions 3 is 50% greater than, i.e., 1.5 times, a product obtained by multiplying the width of the n-type column regions 4 and the impurity concentration of the n-type column regions 4; similarly for 30% p-rich, 10% n-rich, 50% n-rich.

As depicted in FIG. 16A, in an instance of 50% p-rich, when the temperature becomes high (175 degrees C.), the breakdown voltage decreases 58% as compared to room temperature (RT); as depicted in FIG. 16B, in an instance of 30% p-rich, when the temperature becomes high (175 degrees C.), the breakdown voltage decreases 26% as compared to room temperature (RT). On the other hand, as depicted in FIG. 16C, in an instance of 10% n-rich and as depicted in FIG. 16D, in an instance of 50% n-rich as well, even at a high temperature (175 degrees C.), it is found that the breakdown voltage does not decrease.

Thus, in the fifth embodiment, under high temperatures, to prevent the concentration of electric field at locations where the p-type column regions 3 and the $n^+$-type region 22 of a high concentration are in contact with each other, as depicted in FIGS. 15A and 15B, the region S that is in contact with the $n^+$-type region 22 in the longitudinal direction of the n-type column regions 4 and the p-type column regions 3, is set to be n-rich. As a result, deep electron traps and deep hole traps generated by Al ion implantation decrease, de-trapping of majority carriers by high temperatures decreases, and shrinking of the depletion layer is deterred. Thus, portions where the $n^+$-type region 22, which functions as the channel stopper, and the p-type column regions 3 intersect is set to be n-rich, whereby decreases in the breakdown voltage under high temperatures (175 degrees C.) may be suppressed. The p-type column regions 3 and the $n^+$-type region 22, which has a high concentration, are formed by separate processes and formation positions of the ends of the p-type column regions 3 and the $n^+$-type region 22 by mask alignment vary. In the structure in contact with the $n^+$-type region 22 in the longitudinal direction of the n-type column regions 4 and the p-type column regions 3, even when positions of contact shift due to manufacturing variation, the width of the n-type column regions 4 and the width of the p-type column regions 3 are changed to form a portion that is n-rich, whereby the suppression of decreases in the breakdown voltage is not affected and the widths of the n-type column regions 4 and the p-type column regions 3 alone are changed and thus, the degree of freedom in design and in manufacturing is high.

Further, as depicted in FIG. 15C, the p-type column regions 3 of the parallel pn structure 19 are apart from the $n^+$-type region 22 by the distance L in the longitudinal direction of the p-type column regions 3, whereby locations where the p-type column regions 3 and the $n^+$-type region 22 of a high concentration are in contact are eliminated and during a high temperature, breakdown close to the $n^+$-type region 22, which is the channel stopper, may be prevented.

In an instance in which the structure is such that active region is p-rich to increase avalanche breakdown capability, the width of the p-type column regions 3 and the width of the n-type column regions 4 in the active region are constant to the ends thereof and thus, the parallel pn structure may be formed with precision.

Figure 17A:
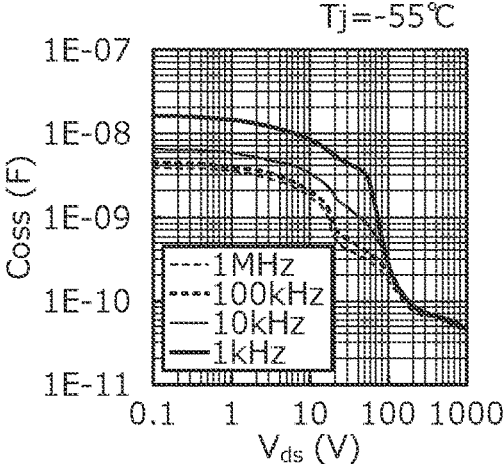
FIG. 17A is a graph depicting a relationship between Vds and $C_{OSS}$ of a full SJ-SiC MOSFET of a breakdown voltage class of 3300V.
Figure 17B:
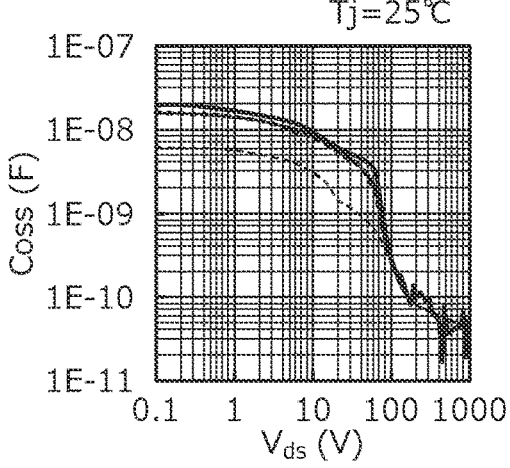
FIG. 17B is a graph depicting a relationship between Vds and $C_{OSS}$ of the full SJ-SiC MOSFET of a breakdown voltage class of 3300V.
Figure 17C:
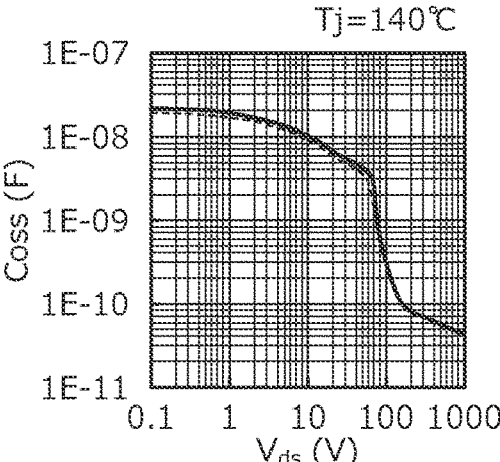
FIG. 17C is a graph depicting a relationship between Vds and $C_{OSS}$ of the full SJ-SiC MOSFET of a breakdown voltage class of 3300V.

FIGS. 17A, 17B, and 17C are graphs depicting a relationship between Vds and $C_{OSS}$ of a full SJ-SiC MOSFET of a breakdown voltage class of 3300V. In FIGS. 17A, 17B, and 17C, a vertical axis indicates output capacitance $C_{OSS}$ in units of F. A horizontal axis indicates the drain-source voltage Vds in units of V. FIGS. 17A, 17B, and 17C depict the relationship between Vds and $C_{OSS}$ in an instance in which the temperature of the SJ-the SiC MOSFET is changed; FIG. 17A depicts an instance of −55 degrees C.; FIG. 17B depicts an instance of 25 degrees C.; and FIG. 17C depicts an instance of 140 degrees C. FIGS. 17A, 17B, and 17C depict instances in which the operating frequency of the SJ-the SiC MOSFET 1 MHz, 100 kHz, 10 kHz, 1 kHz.

Further, in FIGS. 17A, 17B, and 17C, the impurity concentration of the p-type column regions 3 is $6 \times 10^{16}/cm^3$, the impurity concentration of the n-type column regions 4 is $3 \times 10^{16}/cm^3$, the width of the p-type column regions 3 is 1.5 μm, and the width of the n-type column regions 4 is 3.5 μm, whereby the activation rate of the implanted impurities in the p-type column regions 3 is calculated as 70%. Here, with respect to the distribution of the actual doping concentration electrically activated, the activation rate is defined as a value, the implantation dose amount, by which the integrated concentration is divided, the integrated concentration being obtained by integrating the actual doping concentration spanning the region of the p-type column regions 3. The actual doping concentration may be obtained by a commonly known C-V (electrostatic capacitance-applied voltage) measurement.

As depicted in FIGS. 17A, 17B, and 17C, at a low temperature (−55 degrees C.) or room temperature (25 degrees), when the frequency becomes high (1 MHz), $C_{OSS}$ decreases, however, at a high temperature (140 degrees C.), even when the frequency is high or low (1 kHz), $C_{OSS}$ is the same. This is because when a deep state is present, a high frequency cannot be followed and the capacitance appears small. When the frequency is set to be low, following is possible even with a deep trap (state) and thus, the capacitance appears large. Further, when the temperature is increased, carrier response improves, and even when the frequency is high or low, the capacitance appears large. In this manner, when the temperature becomes high and/or the frequency decreases, the capacitance increases. The capacitance increasing means that the depletion layer shrinks. From these results as well, as depicted in FIG. 15, preferably, portions where the $n^+$-type region 22, which functions as the channel stopper, and the p-type column regions 3 intersect may be set to be n-rich.

Figure 18:
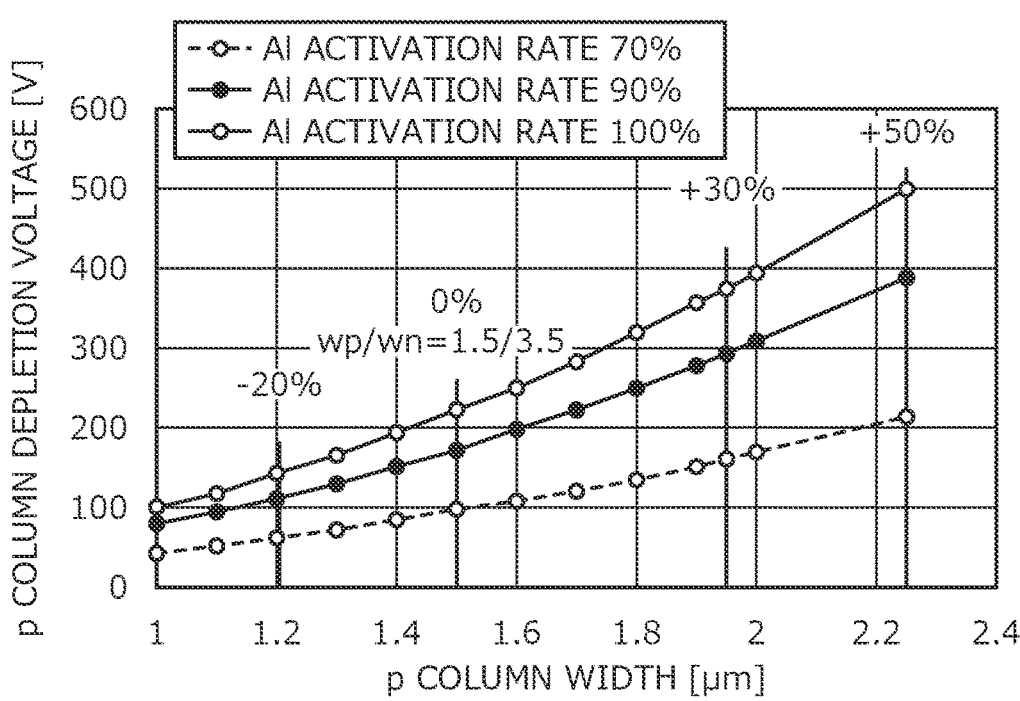
FIG. 18 is a graph depicting a relationship between a width of p-type column regions and depletion voltage of the p-type column regions in a SJ-SiC MOSFET of a breakdown voltage class of 3300V.

FIG. 18 is a graph depicting a relationship between the width of the p-type column regions and depletion voltage of the p-type column regions in a SJ-SiC MOSFET of a breakdown voltage class of 3300V. In FIG. 18, a vertical axis indicates depletion voltage in units of V. A horizontal axis indicates the width of the p-type column regions 3 in units of μm. In FIG. 18, instances in which the activation rate of aluminum implanted in the p-type column regions 3 is 70%, 90%, and 100% are depicted. An instance in which the activation rate is 100% is an instance of formation by epitaxial growth; the activation rates of 70% and 90% indicate an upper limit and a lower limit in an instance of formation by ion implantation. The configuration of the SJ-the SiC MOSFET in FIG. 18 is the same as the configuration of the SJ-the SiC MOSFET in FIGS. 17A, 17B, and 17C.

As depicted in FIG. 18, the width of the p-type column regions 3 increases, i.e., accompanying becoming p-rich, the depletion voltage increases, and accompanying the activation rate increasing, the depletion voltage increases. Thus, the distance L between the p-type column regions 3 and the $n^+$-type region 22 for preventing breakdown close to the $n^+$-type region 22, which is the channel stopper, during high temperatures has to be determined with consideration of the activation rate.

Figure 19:
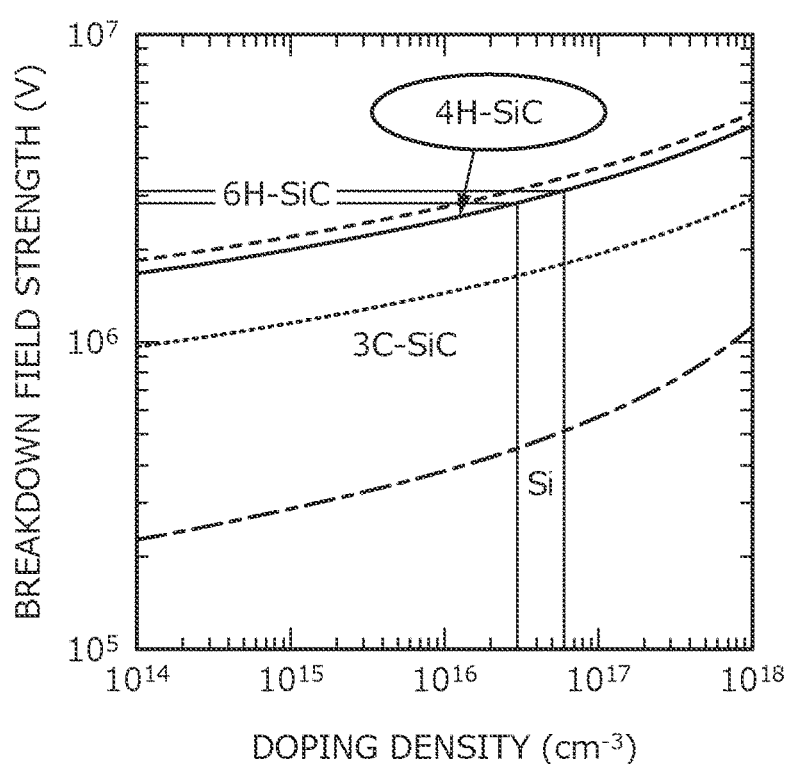
FIG. 19 is a graph depicting doping density dependence of breakdown field.

FIG. 19 is a graph depicting doping density dependence of breakdown field. In FIG. 19, a vertical axis indicates breakdown field in units of V/cm. A horizontal axis indicates doping density in units of/cm³. In FIG. 19, the extent of breakdown in instances of 3C-SiC, 4H-SiC, and 6H-SiC, in addition to Si are depicted. From FIG. 19, with 4H-SiC, in an instance in which the impurity concentration of the p-type column regions 3 (doping density) is $6\times10^{16}$/cm³, the breakdown field is $3\times10^6$V/cm.

Figure 20:
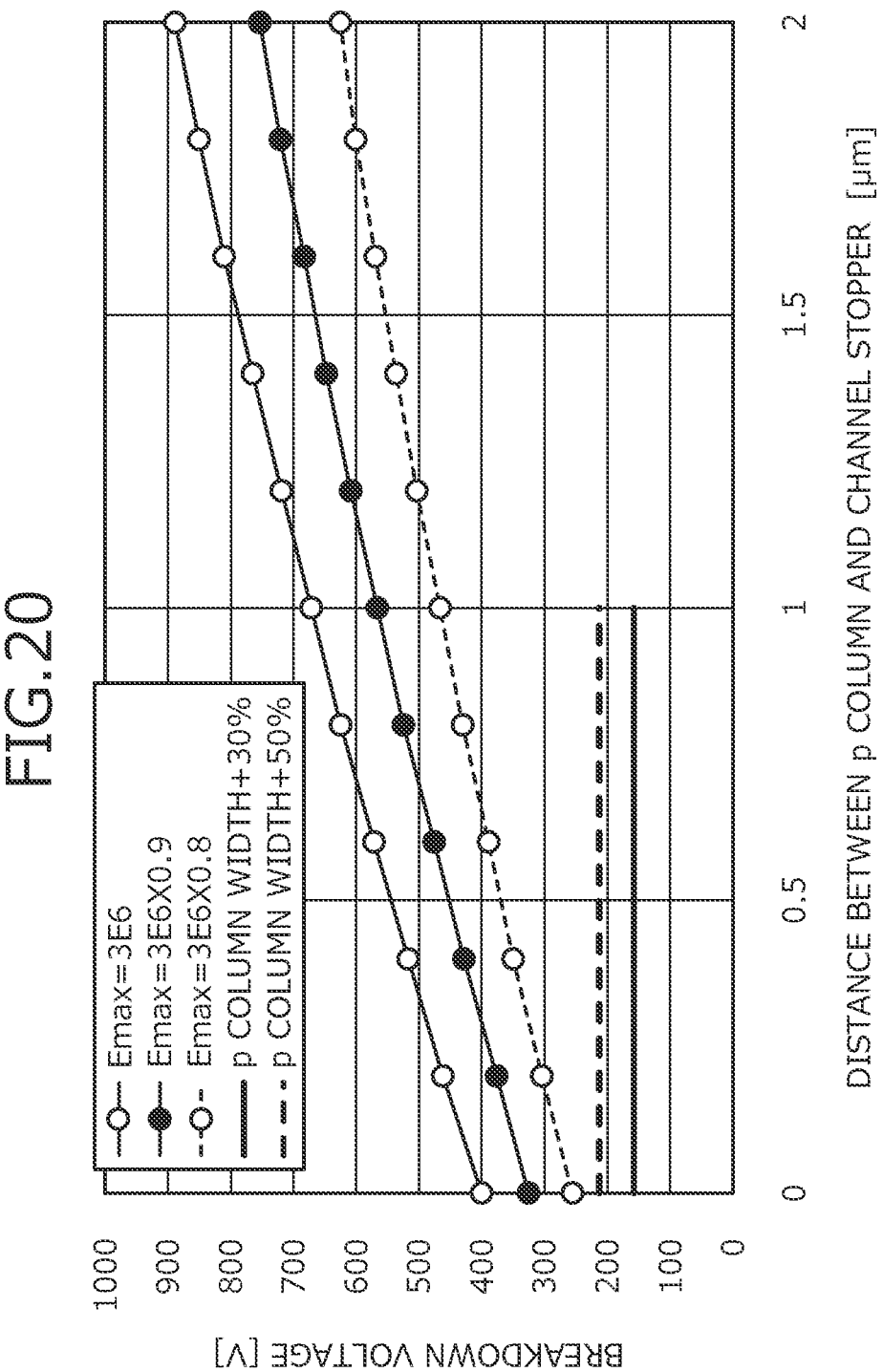
FIG. 20 is a graph depicting a relationship between breakdown voltage and a distance between an $n^+$-type region and p-type column regions in an instance in which an activation rate of Al is 70% (lower limit in an instance of formation by ion implantation).

FIG. 20 is a graph depicting a relationship between the breakdown voltage and the distance between the $n^+$-type region and the p-type column regions in an instance in which the activation rate of Al is 70% (lower limit in an instance of formation by ion implantation). In FIG. 20, a vertical axis indicates the breakdown voltage in units of V. A horizontal axis indicates the distance L between the p-type column regions 3 and the $n^+$-type region 22 in units of μm. FIG. 20 shows results of calculation when the configuration of SJ-the SiC MOSFET is set to be the same as the configuration in FIG. 18. In FIG. 20, an instance in which a breakdown field Emax is $3\times10^6$V/cm and an instance in which for the breakdown field Emax, a horizontal direction Emax is 0.8 times the vertical direction Emax, are present and thus, instances of the breakdown field Emax×0.9 and Emax×0.8 are also calculated. This horizontal direction is a direction with respect to a C-axis of the silicon carbide semiconductor substrate. In a general Si surface, C-plane planar type or m-plane, a-plane trench type MOSFET or IGBT, the depth direction is substantially a C-axis direction and the longitudinal direction of the p-type column regions 3 is orthogonal to the C-axis and thus, the breakdown field Emax uses the horizontal direction Emax and is determined by a magnitude of the distance L. In FIG. 20, the depletion voltage of the p-type column regions 3 is also indicated by straight lines for an instance in which the width of the p-type column regions 3 is set from 1.5 μm, +30%, and +50%, and a p-rich state is set.

As depicted in FIG. 20, in an instance in which the impurity concentration of the p-type column regions 3 is $6\times10^{16}$/cm³ and the activation rate of Al is 70% and in an instance of Emax×0.8, even when the distance L between the p-type column regions 3 and the $n^+$-type region 22 is 0 μm, the p-type column regions 3 deplete and thus, in the $n^+$-type region 22, breakdown does not occur. Therefore, in an instance in which the activation rate of Al exceeds 70%, the distance L between the p-type column regions 3 and the $n^+$-type region 22 is set to be greater than 0 μm.

Figure 21:
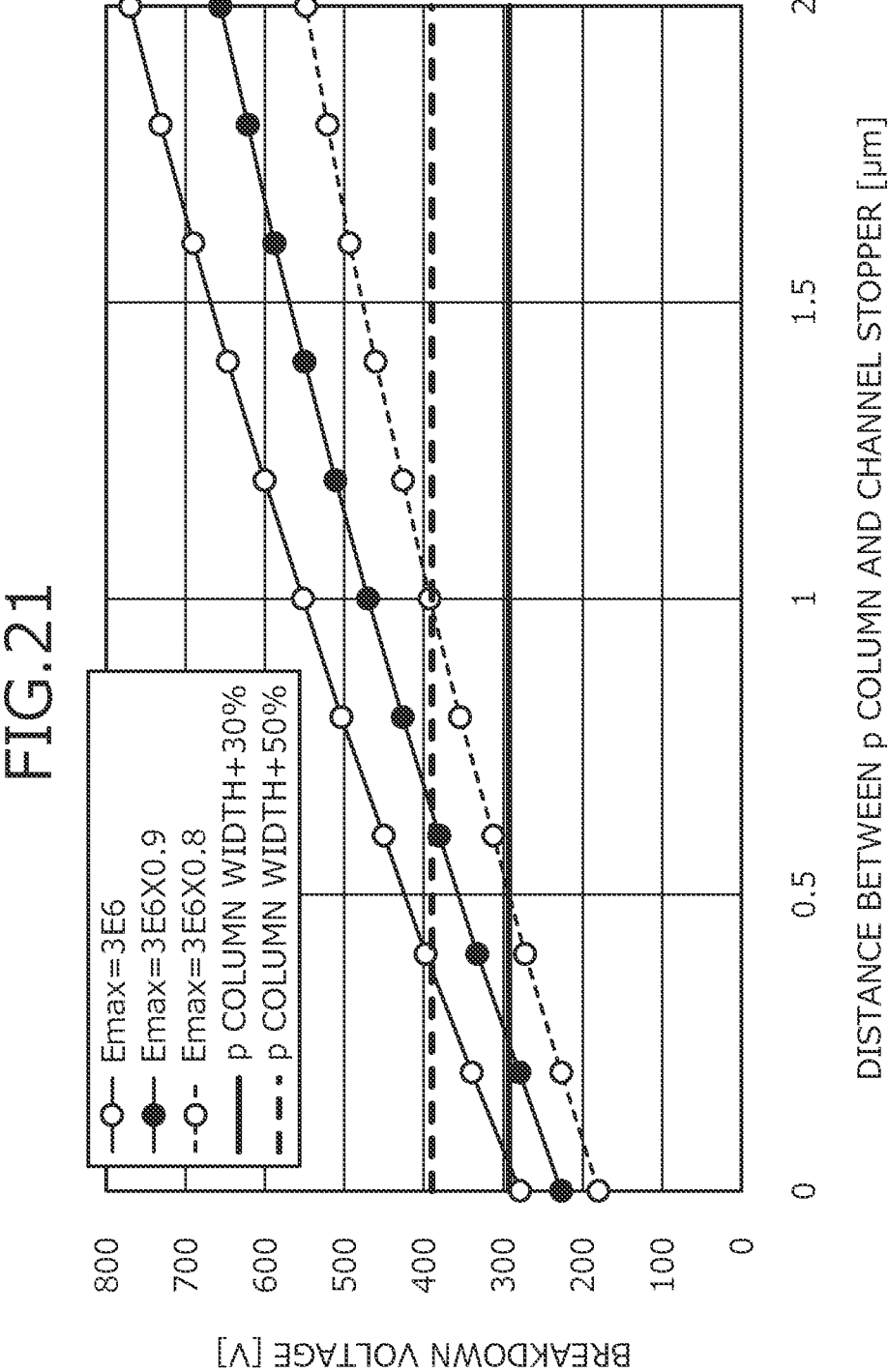
FIG. 21 is a graph depicting a relationship between breakdown voltage and the distance between the $n^+$-type region and the p-type column regions in an instance when the activation rate of Al is 90% (upper limit in an instance of formation by ion implantation).

FIG. 21 is a graph depicting a relationship between the breakdown voltage and the distance between the $n^+$-type region and the p-type column regions in an instance when the activation rate of Al is 90% (upper limit in an instance of formation by ion implantation). In FIG. 21, a vertical axis indicates the breakdown voltage in units of V. A horizontal axis indicates the distance L between the p-type column regions 3 and the $n^+$-type region 22 in units of μm. FIG. 21 shows results of calculation for a same configuration as that in FIG. 20.

As depicted in FIG. 21, when the impurity concentration of the p-type column regions 3 is $6\times10^{16}$/cm³, in an instance of the activation rate of Al being 90% and an instance of the breakdown field Emax, when the width of the p-type column regions 3 is +30% and the distance L between the p-type column regions 3 and the $n^+$-type region 22 is 0.1 μm or less, breakdown occurs close to the $n^+$-type region 22. Thus, preferably, the distance L between the p-type column regions 3 and the $n^+$-type region 22 may be greater than 0.1 μm.

Further, in an instance of the breakdown field Emax, when the width of the p-type column regions 3 is +50% and the distance L between the p-type column regions 3 and the $n^+$-type region 22 is 0.4 μm or less, breakdown occurs close to the $n^+$-type region 22. Further, in an instance in which the horizontal direction Emax is less than the vertical direction Emax, i.e., in an instance of Emax×0.8, a necessary distance is further added.

Figure 22:
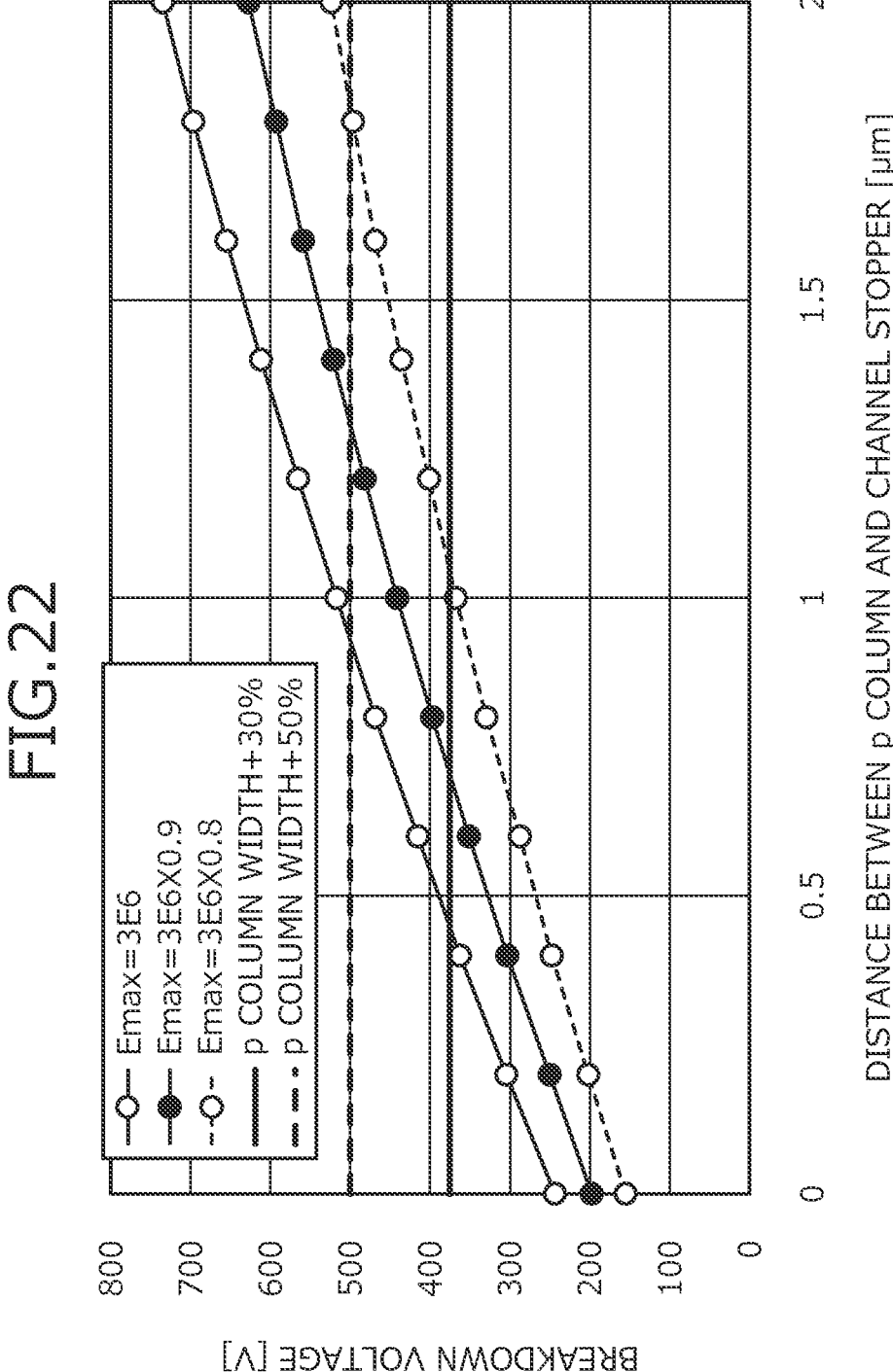
FIG. 22 is a graph depicting a relationship between breakdown voltage and the distance between the $n^+$-type region and the p-type column regions in an instance in which the activation rate of Al is 100%.

FIG. 22 is a graph depicting a relationship between the breakdown voltage and the distance between the $n^+$-type region and the p-type column regions in an instance in which the activation rate of Al is 100%. The activation rate of Al being 100%, for example, is an instance in which the p-type column regions 3 are formed by epitaxial growth. In FIG. 22, a vertical axis indicates the breakdown voltage in units of V. A horizontal axis indicates the distance L between the p-type column regions 3 and the $n^+$-type region 22 in units of μm. FIG. 22 shows results of calculation for a same configuration as that in FIG. 20.

As depicted in FIG. 22, when the impurity concentration of the p-type column regions 3 is $6\times10^{16}$/cm³, in an instance of the activation rate of Al being 100% and an instance of the breakdown field Emax, when the width of the p-type column regions 3 is +30% and the distance L between the p-type column regions 3 and the $n^+$-type region 22 is 0.4 μm or less, breakdown occurs close to the $n^+$-type region 22. Thus, preferably, the distance L between the p-type column regions 3 and the $n^+$-type region 22 may be greater than 0.4 μm.

Further, in an instance of the breakdown field Emax, when the width of the p-type column regions 3 is +50% and the distance L between the p-type column regions 3 and the $n^+$-type region 22 is 1.0 μm or less, breakdown occurs close to the $n^+$-type region 22. Thus, preferably, the distance L between the p-type column regions 3 and the $n^+$-type region 22 may be greater than 1.0 μm. Further, in an instance in which the horizontal direction Emax is less than the vertical direction Emax, i.e., an instance of Emax×0.8, a necessary distance is further added.

Figure 23A:
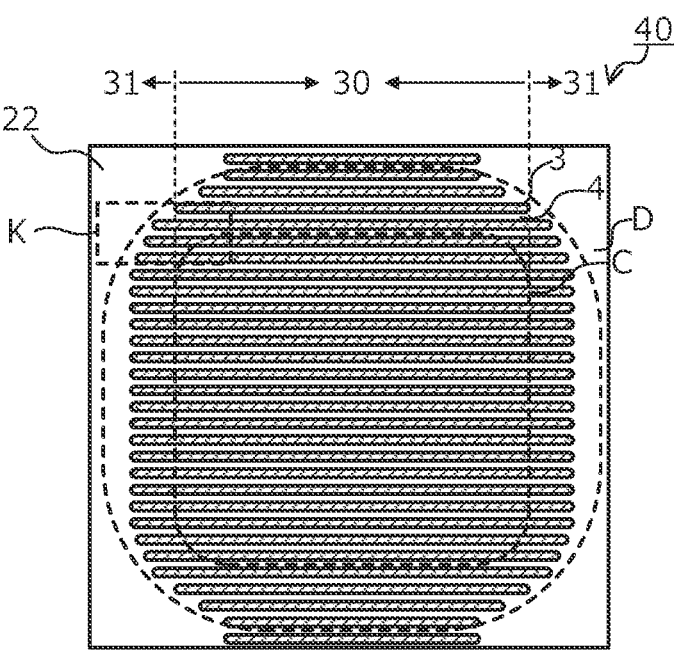
FIG. 23A is a top view of a superjunction semiconductor device according to a fifth embodiment.
Figure 23B:
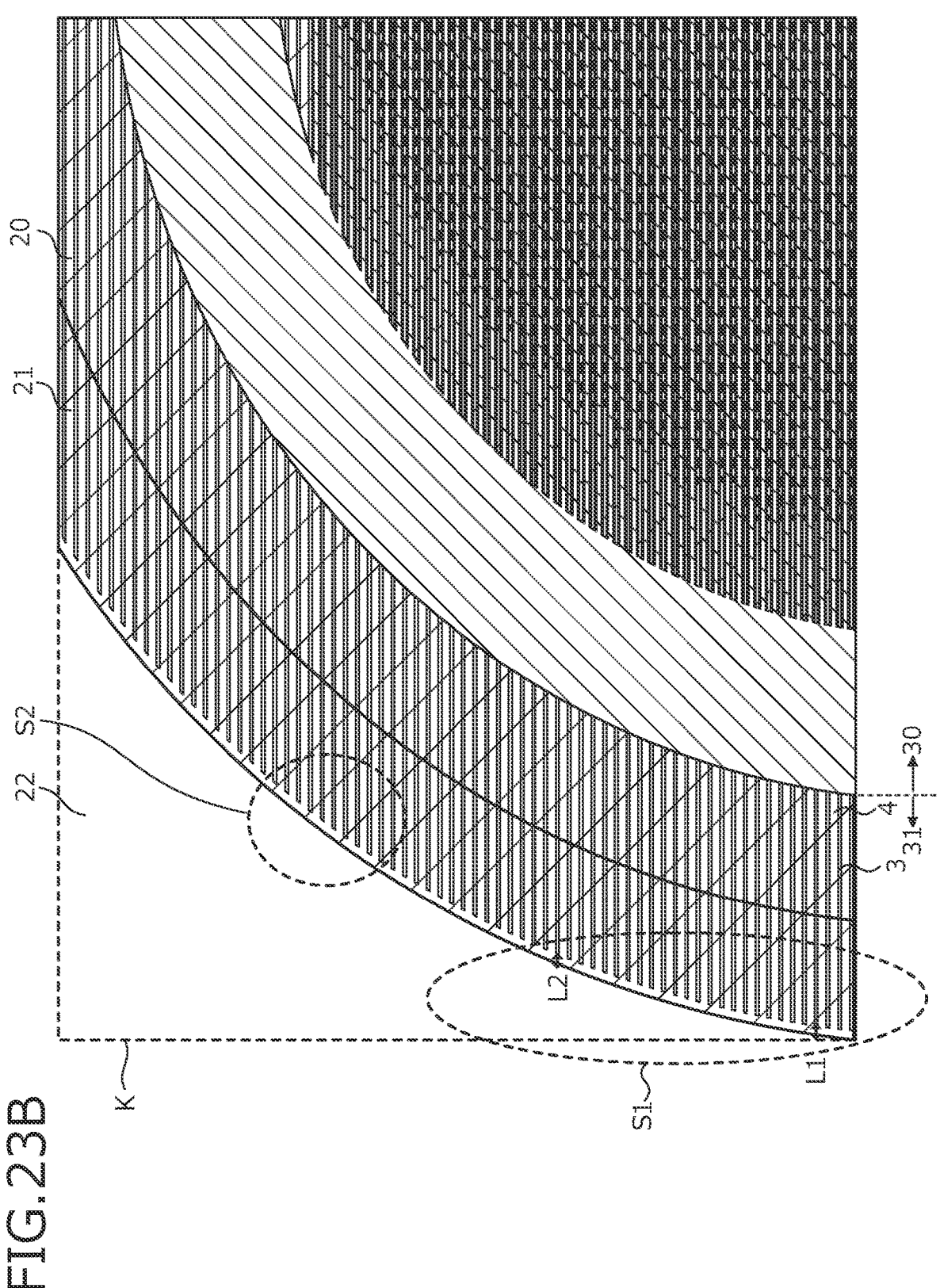
FIG. 23B is an enlarged planar view of a portion K of the structure close to the $n^+$-type region and the p-type column regions, at one of the four corners.
Figure 24:
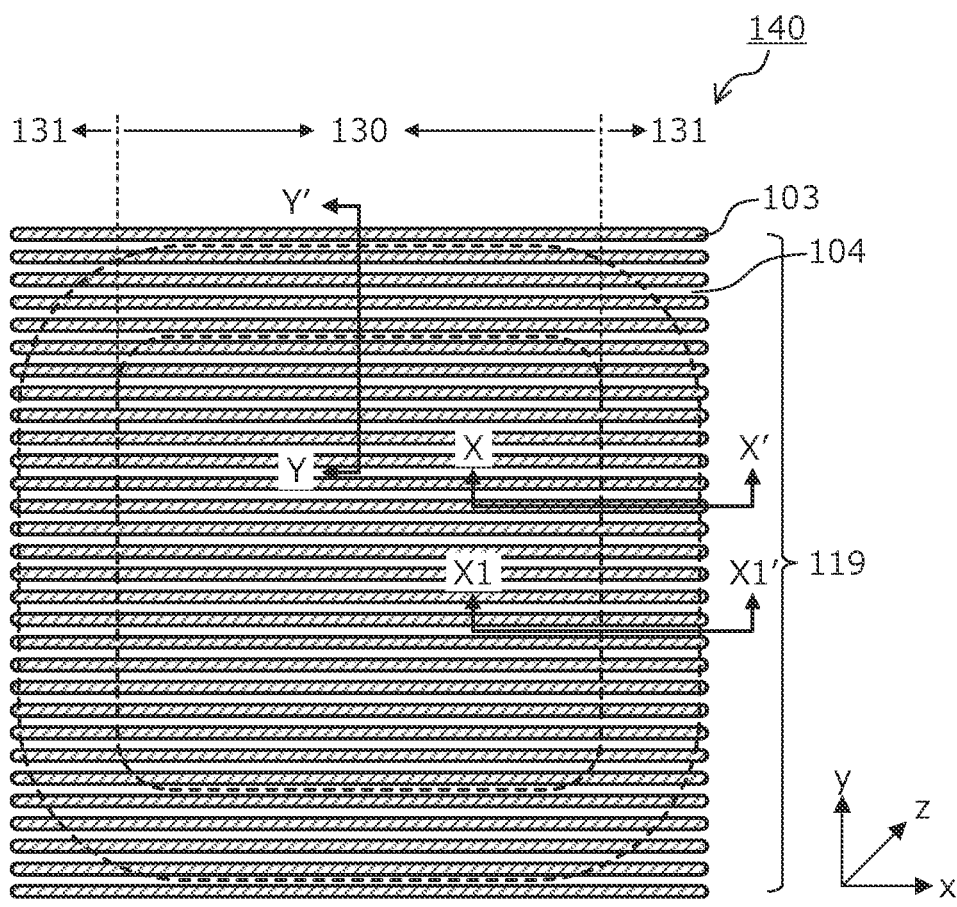
FIG. 24 is a plan view depicting a structure of a conventional superjunction semiconductor device.
Figure 25A:
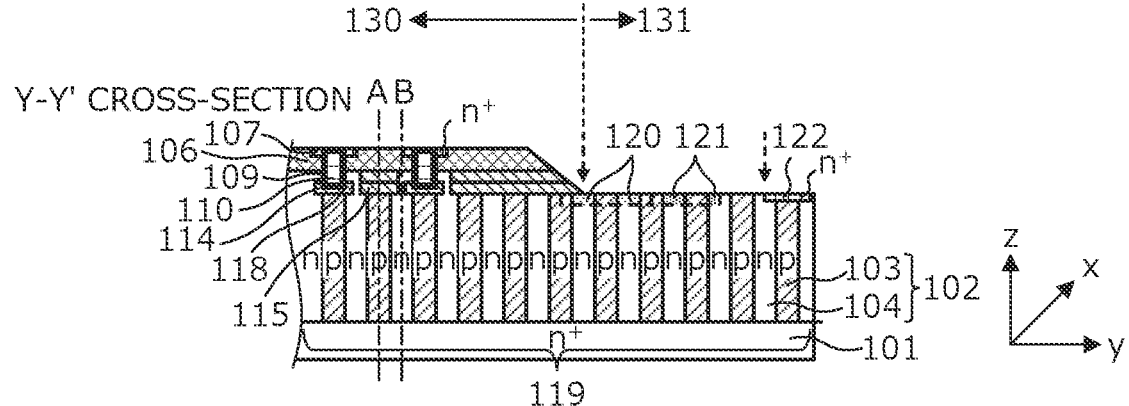
FIG. 25A is a cross-sectional view depicting the structure of the conventional superjunction semiconductor device.
Figure 25B:
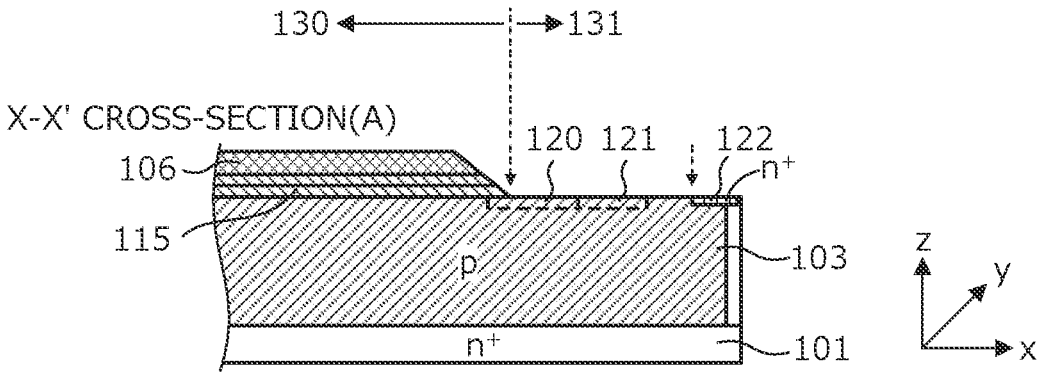
FIG. 25B is a cross-sectional view depicting the structure of the conventional superjunction semiconductor device.
Figure 25C:
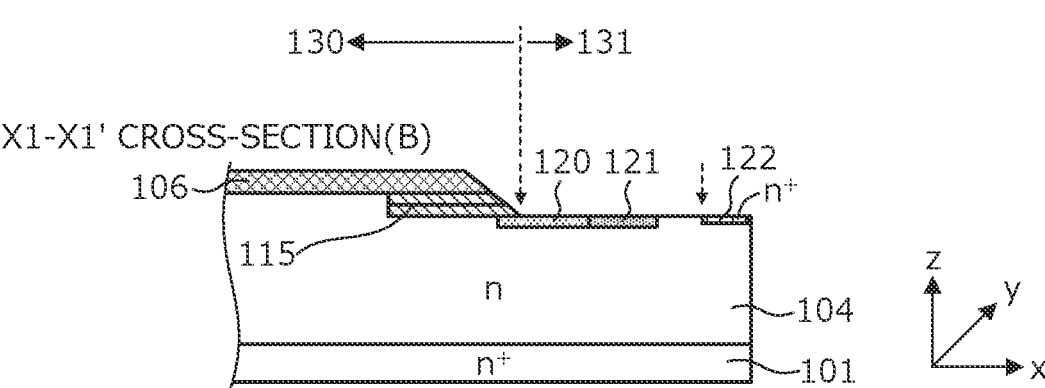
FIG. 25C is a cross-sectional view depicting the structure of the conventional superjunction semiconductor device.

FIG. 23A is a top view of a superjunction semiconductor device according to a fifth embodiment; FIG. 23B is an enlarged planar view of a portion K of the structure close to the $n^+$-type region and the p-type column regions, at one of the four corners. The $n^+$-type region 22 is provided so as to surround the active region 30 and is configured by linear portions and curved portions of corner portions. Preferably, as depicted in the region surrounded by a dotted line S1 in FIG. 23B, in the longitudinal direction of the p-type column regions 3, the distance L1 between the p-type column regions 3 and the $n^+$-type region 22, may be uniform at the linear portions of the $n^+$-type region 22. Further, preferably, a distance L2 between the $n^+$-type region 22 and the p-type column regions 3, at the corner portions of the $n^+$-type region 22 may be equal to or greater than the distance L1 of the linear portions.

Further, as depicted in the region surrounded by a dotted line S2 in FIG. 23B, the ends of the p-type column regions 3 in the longitudinal direction thereof, are staggered according to the curvature of the $n^+$-type region 22 at the corner portions of the $n^+$-type region 22. As a result, at the corner portions as well, the distance between the $n^+$-type region 22 and the p-type column regions 3 is uniform.

A method of manufacturing the superjunction semiconductor device 4 according to the fifth embodiment may be implemented by reducing the width of the p-type column regions 3 or forming the p-type column regions 3 so as to not reach the $n^+$-type region 22 in the longitudinal direction of the p-type column regions 3, in the method of manufacturing the superjunction semiconductor device 40 according to the first embodiment.

As described above, according to the fifth embodiment, a region in contact with the $n^+$-type region in the longitudinal direction of the n-type column regions and the p-type column regions, is n-rich. As a result, deep electron traps and deep hole traps generated by Al ion-implantation are reduced, de-trapping of majority carriers under high temperatures is reduced, and shrinking of the depletion layer is deterred. Thus, portions where the $n^+$-type region 22, which functions as the channel stopper, and the p-type column regions 3 intersect is set to be n-rich, whereby decreases in the breakdown voltage under high temperatures (175 degrees C.) may be suppressed. Further, the p-type column regions of the parallel pn structure are apart from the $n^+$-type region by the distance L in the longitudinal direction of the p-type column regions, whereby locations where the p-type column regions and the $n^+$-type region of a high concentration are eliminated and thus, under high temperatures, breakdown close to the $n^+$-type region that is a channel stopper may be prevented.

In the foregoing, in the present invention, while an instance of a structure in which a MOS gate structure is configured in the silicon carbide substrate, at the first main surface thereof is described as an example, without limitation hereto, various modifications are possible such as the surface orientation of the substrate main surface, etc. Further, in the present invention, in the embodiments, while the first conductivity type is assumed to be an n-type and the second conductivity type is assumed to be a p-type, the present invention is similarly implemented when the first conductivity type is a p-type and the second conductivity type is an n-type. Further, the present invention is appliable to not only semiconductor devices having a trench structure in which a channel is formed orthogonal to the substrate surface but to also a planar structure in which a channel is formed parallel to the substrate surface. Further, in the embodiments described above, while an instance in which silicon carbide is used as a wide band gap semiconductor is described as an example, when a wide band gap semiconductor other than silicon carbide such as gallium nitride (GaN) or a semiconductor other than a wide band gap semiconductor such as silicon is used, similar effects are obtained. Further, in the present invention, while an example in which the trenches 18 have a structure parallel to the longitudinal direction of the p-type column regions 3 and the n-type column regions 4 is described, similar effects are obtained even when the trenches 18 have a structure orthogonal to, the longitudinal direction of the p-type column regions 3 and the n-type column regions 4.

According to the invention described above, p-type column regions (plurality of second columns of the second conductivity type) of the termination-region second parallel pn structure are apart from the $n^+$-type region (channel stopper), whereby the p-type impurity amount of the termination-region second parallel pn structure is less than the p-type impurity amount of the active-region parallel pn structure and the p-type impurity amount of the termination-region first parallel pn structure. As a result, in a low voltage state in which a neutral region remains in the edge termination region, concentration of electric field at portions where the channel stopper and the p-type column regions overlap may be prevented, electric field close to the channel stopper is mitigated, and decreases in the breakdown voltage of the edge termination region may be suppressed.

The superjunction semiconductor device according to the present invention achieves an effect in that electric field close to the channel stopper is mitigated and decreases in the breakdown voltage of the edge termination region may be suppressed.

As described above, the superjunction semiconductor device according to the present invention is useful for high-voltage semiconductor devices used in power converting equipment, power source devices such as those of various types of industrial machines, etc.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A superjunction semiconductor device, having
an active region through which a current flows, and
a termination structure portion, which is disposed at an outer periphery of the active region in a plan view of the superjunction semiconductor device, and in which a voltage withstanding structure is formed,
the superjunction semiconductor device comprising:
a semiconductor substrate of a first conductivity type having a main surface;
a first semiconductor layer of the first conductivity type, provided on the main surface of the semiconductor substrate, the first semiconductor layer having an impurity concentration that is lower than an impurity concentration of the semiconductor substrate;
a parallel pn structure provided in the first semiconductor layer at a surface thereof; and
a channel stopper provided in the first semiconductor layer at the surface thereof, the channel stopper surrounding the parallel pn structure in the plan view of the device, and being in contact with the parallel pn structure in the termination structure portion, wherein
the parallel pn structure includes:
a plurality of first columns of the first conductivity type each having a first width in a width direction, and
a plurality of second columns of a second conductivity type each having a second width in the width direction,
the first and second columns repeatedly alternating one another in a striped pattern parallel to the main surface; and
the parallel pn structure has a region that is in contact with the channel stopper and overlaps the channel stopper in the plan view, and in said region a product obtained by multiplying the second width and an impurity concentration of the plurality of second columns is less than a product obtained by multiplying the first width and an impurity concentration of the plurality of first columns.

2. The superjunction semiconductor device according to claim 1, further comprising in the active region:

a second semiconductor layer of the second conductivity type, provided at a surface of the parallel pn structure;

a first semiconductor region of the first conductivity type, selectively provided in the second semiconductor layer, at a surface of the second semiconductor layer;

a gate insulating film provided at the surface of the second semiconductor layer, the gate insulating film having a first surface and a second surface opposite to each other, the second surface being in contact with the second semiconductor layer; and a gate electrode provided on the first surface of gate insulating film.

3. The superjunction semiconductor device according to claim 1, wherein the plurality of first columns and the plurality of second columns of the parallel pn structure are separated from the semiconductor substrate.

4. The superjunction semiconductor device according to claim 1, wherein the semiconductor substrate contains a wide band gap semiconductor.

5. The superjunction semiconductor device according to claim 1, wherein the channel stopper is of the first conductivity type.

6. The superjunction semiconductor device according to claim 1, wherein the semiconductor substrate contains a silicon carbide semiconductor, the first conductivity type is an n-type formed by an addition of nitrogen to the silicon carbide semiconductor, and the second conductivity type is a p-type formed by an addition of aluminum to the silicon carbide semiconductor.

7. A superjunction semiconductor device, having an active region through which a current flows, and a termination structure portion, which is disposed at an outer periphery of the active region in a plan view of the superjunction semiconductor device, and in which a voltage withstanding structure is formed, the superjunction semiconductor device comprising:

a semiconductor substrate of a first conductivity type having a main surface;

a first semiconductor layer of the first conductivity type, provided on the main surface of the semiconductor substrate, the first semiconductor layer having an impurity concentration that is lower than an impurity concentration of the semiconductor substrate;

a parallel pn structure provided in the first semiconductor layer at a surface thereof; and a channel stopper provided in the first semiconductor layer at the surface thereof, the channel stopper surrounding the parallel pn structure in the plan view of the device, and being in contact with the parallel pn structure in the termination structure portion, wherein the channel stopper has a plurality of linear portions and a plurality of corner portions;

the parallel pn structure includes:

a plurality of first columns of the first conductivity type each having a first width in a width direction, and a plurality of second columns of a second conductivity type each having a second width in the width direction, the first and second columns repeatedly alternating one another in a striped pattern parallel to the main surface;

the plurality of second columns are provided apart from the channel stopper in a longitudinal direction that is orthogonal to the width direction, a first distance, which is a distance in the longitudinal direction between the channel stopper and an end of any of the plurality of second columns at the linear portions of the channel stopper, being uniform and being no greater than a second distance that is a distance in the longitudinal direction between the channel stopper and an end of any of the plurality of second columns at the corner portions of the channel stopper;

at the ends of the plurality of second columns, a product obtained by multiplying the second width and an impurity concentration of the plurality of second columns is at least equal to a product obtained by multiplying the first width and an impurity concentration of the plurality of first columns; and the plurality of second columns are implanted with an impurity of the second conductivity type, and an activation rate of the implanted impurity is greater than 70% but not more than 90%.

8. The superjunction semiconductor device according to claim 7, wherein the plurality of second columns and the channel stopper are apart from each other by at least 0.1 μm in the longitudinal direction.

9. The superjunction semiconductor device according to claim 7, wherein the plurality of second columns and the channel stopper are apart from each other by at least 0.4 μm in the longitudinal direction.

10. The superjunction semiconductor device according to claim 7, wherein the ends of the plurality of second columns of the parallel pn structure, in the longitudinal direction, are staggered at each of the corner portions of the channel stopper according to a curvature of said each corner portion of the channel stopper.

11. The superjunction semiconductor device according to claim 7, further comprising in the active region:

a second semiconductor layer of the second conductivity type, provided at a surface of the parallel pn structure;

a first semiconductor region of the first conductivity type, selectively provided in the second semiconductor layer, at a surface of the second semiconductor layer;

a gate insulating film provided at the surface of the second semiconductor layer, the gate insulating film having a first surface and a second surface opposite to each other, the second surface being in contact with the second semiconductor layer; and a gate electrode provided on the first surface of gate insulating film.

12. The superjunction semiconductor device according to claim 7, wherein the plurality of first columns and the plurality of second columns of the parallel pn structure are separated from the semiconductor substrate.

13. The superjunction semiconductor device according to claim 7, wherein the semiconductor substrate contains a wide band gap semiconductor.

14. The superjunction semiconductor device according to claim 7, wherein the channel stopper is of the first conductivity type.

15. The superjunction semiconductor device according to claim 7, wherein the semiconductor substrate contains a silicon carbide
  semiconductor, the first conductivity type is an n-type formed by an
  addition of nitrogen to the silicon carbide semiconduc-
  tor, and the second conductivity type is a p-type formed by an
  addition of aluminum to the silicon carbide semicon-
  ductor.

* * * * *